United States Patent [19]
Wong et al.

[11] Patent Number: 6,004,399
[45] Date of Patent: *Dec. 21, 1999

[54] ULTRA-LOW PARTICLE SEMICONDUCTOR CLEANER FOR REMOVAL OF PARTICLE CONTAMINATION AND RESIDUES FROM SURFACE OXIDE FORMATION ON SEMICONDUCTOR WAFERS

[75] Inventors: Kaichiu Wong, Sunnyvale; Krishnaswamy Ramkumar; Hanna Bamnolker, both of San Jose; Suraj Puri, Los Altos; Rajiv Bhushan, Palo Alto; David Wong; Gary Elmore, both of San Jose; Raj Mohindra, Los Altos, all of Calif.

[73] Assignee: Cypress Semiconductor Corporation, San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/784,207

[22] Filed: Jan. 15, 1997

Related U.S. Application Data

[63] Continuation of application No. 08/674,055, Jul. 1, 1996, abandoned.

[51] Int. Cl.⁶ .................................................. B08B 3/08
[52] U.S. Cl. ........................... 134/2; 134/25.4; 134/30; 134/95.2; 134/902
[58] Field of Search ........................... 134/2, 25.4, 25.5, 134/26, 30, 37, 40, 902, 95.2

[56] References Cited

U.S. PATENT DOCUMENTS

| | | | |
|---|---|---|---|
| 3,281,915 | 11/1966 | Schramm | 29/25.3 |
| 4,079,522 | 3/1978 | Ham | 34/1 |
| 4,186,032 | 1/1980 | Ham | 134/31 |
| 4,261,791 | 4/1981 | Shwartzman | 156/628 |
| 4,318,749 | 3/1982 | Mayer | 134/25.4 |
| 4,326,553 | 4/1982 | Hall | 134/153 |
| 4,543,130 | 9/1985 | Shwartzman | 134/1 |
| 4,778,532 | 10/1988 | McConnell et al. | 134/10 |
| 4,911,761 | 3/1990 | McConnell et al. | 134/11 |
| 5,013,366 | 5/1991 | Jackson et al. | 134/1 |
| 5,181,985 | 1/1993 | Lampert et al. | 156/635 |
| 5,288,333 | 2/1994 | Tanaka et al. | 134/31 |
| 5,320,978 | 6/1994 | Hsu | 437/192 |
| 5,542,441 | 8/1996 | Mohindra et al. | 135/95.2 |
| 5,555,902 | 9/1996 | Menon | 134/199 |
| 5,571,337 | 11/1996 | Mohindra et al. | 134/25.4 |
| 5,589,422 | 12/1996 | Bhat | 437/228 |
| 5,634,978 | 6/1997 | Mohindra et al. | 134/2 |
| 5,651,379 | 7/1997 | Mohindra et al. | 134/95.2 |
| 5,666,985 | 9/1997 | Smith, Jr. et al. | 134/142 |
| 5,685,327 | 11/1997 | Mohindra et al. | 134/95.2 |

OTHER PUBLICATIONS

Ahmed A. Busnaina et al., "An Experimental Study of Megasonic Cleaning of Silicon Wafers," *J. Electrochem. Soc.*, vol. 142, No. 8, Aug. 1995, pp. 2812–2817.

C. J. Gow et al., "A Method for Evaluating Cleaning Techniques for the Removal of Particulates from Semiconductor Surfaces," Proceedings of the 2nd International Symposium on Cleaning Technology in Semiconductor Device Manufacturing, 1992, pp. 366–371.

(List continued on next page.)

*Primary Examiner*—Philip R. Coe
*Attorney, Agent, or Firm*—Long Aldridge & Norman LLP; Steven B. Kelber

[57] ABSTRACT

A method is described for cleaning a semiconductor wafer. The method includes immersing a wafer in a liquid comprising water. The wafer has a front face, a back face, and an edge. The method also includes providing a substantially particle free environment adjacent to the front face and the back face as the liquid is being removed. A step of introducing a carrier gas comprising a cleaning enhancement substance also is included. It is believed that the cleaning enhancement substance dopes any liquid adhered to the front and back faces of the wafer to cause a concentration gradient of the cleaning enhancement substance in the liquid and accelerate removal of the adhered liquid off of the water.

20 Claims, 18 Drawing Sheets

OTHER PUBLICATIONS

R. Mark Hall et al., "Effect of SC–1 Process Parameters on Particle Removal and Surface Metallic Contamination," Mat. Res. Soc. Symp. Proc., vol. 386, 1995, pp. 127–134.

P. J. Resnick et al. "A Study of Cleaning Performance and Mechanisms in Dilute SC–1 Processing," Mat. Res. Soc. Symp. Proc., vol. 386, 1995, pp. 21–26.

G. J. Norga et al., "Simulation and in situ monitoring of metallic contamination and surface roughening in wet wafer cleaning solutions," *Materials Science and Technology*, vol. 11, Jun. 1995, pp. 90–93.

Dr. Klaus Wolke et al., "Marangoni Drying for Hydrophilic and Hydrophobic Wafers," *Semiconductor Fabtech*, believed to have been published in Jul. 1996 at pp. 215–218.

Pieter Burggraaf (Senior Editor), "Keeping the 'RCA' in Wet Chemistry Cleaning," *Semiconductor International*, Jun. 1994.

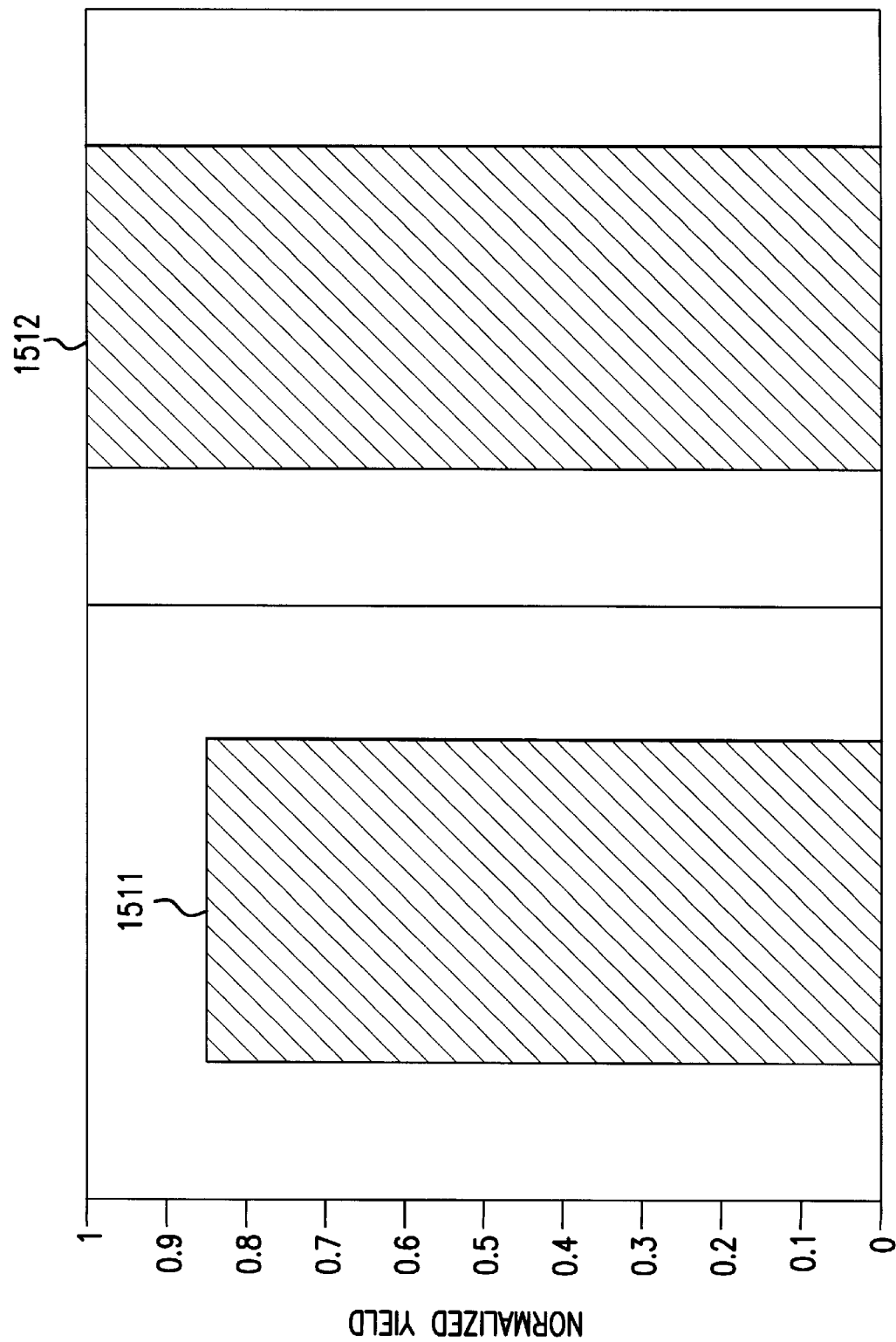

ULTRA-LOW PARTICLE SEMICONDUCTOR CLEANER FOR REMOVAL OF PARTICLE CONTAMINATION AND RESIDUES FROM SURFACE OXIDE FORMATION ON SEMICONDUCTOR WAFERS

This is a continuation of application Ser. No. 08/674,055, filed on Jul. 1, 1996 abandoned.

BACKGROUND OF THE INVENTION

The invention relates to the field of semiconductor integrated circuits. The invention is illustrated in an example with regard to a semiconductor integrated circuit cleaning technique, including a method and apparatus, but it will be recognized that the invention has a wider range of applicability. Merely by way of example, the invention can also be applied to the manufacture of raw wafers, lead frames, medical devices, disks and heads, flat panel displays, microelectronic masks, and other applications requiring high purity wet processing such as steps of rinsing, cleaning, drying, and the like.

Industry utilizes or has proposed various techniques to rinse, clean and/or dry a semiconductor wafer. An example of a conventional technique used to rinse a wafer is a cascade rinse. The cascade rinse utilizes a cascade rinser which includes inner and outer chambers, each separated by a partition. Rinse water flows from a water source into the inner chamber. The rinse water from the inner chamber cascades into the outer chamber. An in-process wafer such as an etched wafer is typically rinsed in the cascade rinser by dipping the etched wafer into the rinse water of the inner chamber. This process is often used to neutralize and remove acid from the etched wafer.

A limitation with the cascade rinser is that "dirty water" often exists in the first chamber. The dirty water includes "particles", such as residual acid and/or other materials which often attach to the wafer. Herein, "particles" refers to any material that desirably should be removed from the wafer or other object to be cleaned. For example, with respect to cleaning of silicon wafers, particles can include any material that, if not removed from the wafer, can adversely affect the stability, performance, reliability or longevity of devices produced from the wafer. These particles often cause defects in the integrated circuit, thereby reducing the number of good dies on a typical wafer. Another limitation with the cascade rinser is wafers from the cascade rinser must still undergo a drying operation. A subsequent drying operation often introduces more particles onto the integrated circuit. More particles on the integrated circuit typically further decrease the number of good dies on the wafer. Accordingly, the cascade rinser often cannot clean or remove particles from the wafer.

Another technique often used to rinse wafers is the "quick dump" method. The quick dump method relies upon the rapid deployment of water from the rinse tank to remove water and impurities from the semiconductor wafer. A limitation with this method is its inability to actually clean or remove particles from the wafer. In fact, the rapid deployment of water from the tank often transfers more particles onto the wafer. In addition, the wafers from the quick dump tank must still undergo a drying operation, further increasing the number of particles on the wafer. As previously noted, more particles often relates to lower die yields on the semiconductor wafer.

A further technique used to both rinse and dry wafers relies upon a spin rinse/dryer. The spin rinse/dryer uses a combination of rinse water spray to rinse and centrifugal force to remove water from the semiconductor wafer. The dry step removes water from the semiconductor wafer substantially by centrifugal force and evaporation. However, the spin rinse/dryer often introduces more particles onto the wafer. In fact, initially dissolved or suspended contaminants such as particles in the water are often left on the semiconductor wafer, thereby reducing the number of good dies on the wafer. Another limitation with the spin rinse/dryer is its complex mechanical design with moving parts and the like. The complex mechanical design often leads to problems such as greater downtime, wafer breakage, more spare parts, greater costs, among others. A further limitation is static electricity often builds up on the wafers during the spin cycle, thereby attracting even more particles onto the surface of the semiconductor. Accordingly, the spin rinse/drying does not clean or remove particles from the wafer.

Other techniques used to dry wafers include an isopropyl alcohol (IPA) vapor dryer, full displacement IPA dryer, and others. These IPA-type dryers often rely upon a large quantity of a solvent such as isopropyl alcohol and other volatile organic liquids to facilitate drying of the semiconductor wafer. An example of such a technique is described in U.S. Pat. No. 4,911,761, and its related applications, in the name of McConnell et al. and assigned to CFM Technologies, Inc. McConnell et al. generally describes the use of a superheated or saturated drying vapor as a drying fluid. This superheated or saturated drying vapor often requires the use of large quantities of a hot volatile organic material. The superheated or saturated drying vapor forms a thick organic vapor layer overlying the rinse water to displace (e.g., plug flow) such rinse water with the drying vapor. The thick vapor layer forms an azeotropic mixture with water, which will condense on wafer surfaces, and will then evaporate to dry the wafer.

A limitation with this type of dryer is its use of the large solvent quantity, which is hot, highly flammable, and extremely hazardous to health and the environment. Another limitation with such a dryer is its cost, which is often quite expensive. In fact, this dryer needs a vaporizer and condenser to handle the large quantities of hot volatile organic material. Still further, it has been determined that large quantities of hot volatile organic material are typically incompatible with most photoresist patterned wafers, and are also detrimental to certain device structures.

Still another technique relies upon a hot deionized (DI) process water to rinse and promote drying of the semiconductor wafer. By way of the hot DI water, the liquid on the wafer evaporates faster and more efficiently than standard room temperature DI water. However, hot water often produces stains on the wafer, and also promotes build-up of bacterial and other particles. Another limitation is water is often expensive to heat, and hot DI water is also an aggressive solvent. As an aggressive solvent, it often deteriorates equipment and facilities, thereby increasing maintenance operation costs.

As line size becomes smaller and the complexity of semiconductor integrated circuits increases, it is clearly desirable to have a wet processing technique, including a method and apparatus, that actually removes particles, prevents additional particles, and does not introduce stains on the wafers. The complete wet processing technique may also include a step of drying the wafers, without other adverse results. A further desirable characteristic includes reducing or possibly eliminating the residual water left on wafer surfaces and edges when water is removed (a meniscus). The water left on such surfaces and edges often attracts and introduces more particles onto the semiconductor wafer. The aforementioned conventional techniques fail to provide such desired features, thereby reducing the die yield on the semiconductor during the wet processes.

From the above, it is seen that a method and apparatus for rinsing, cleaning and/or drying semiconductor integrated circuits that is safe, easy, and reliable is often desired.

SUMMARY OF THE INVENTION

The invention provides a safe, efficient, and economical method and apparatus to rinse, clean and/or dry a substrate (or other object) such as a semiconductor wafer. The invention is especially useful in cleaning semiconductor wafers that have undergone an oxidation step within a diffusion furnace followed by an etching step (with, for example, an acid such as diluted hydrofluoric acid) that removes some of the oxide to expose the semiconductor surface. In particular, the present method provides an improved technique that actually removes or reduces the amount of particles from the substrate and also effectively cleans the substrate. The invention also provides an in situ rinsing, cleaning and/or drying system with substantially no mechanical movement of the substrate.

One aspect of the invention provides a method for cleaning a semiconductor wafer. The method includes immersing a wafer having a front face, a back face, and an edge in a liquid comprising water. The liquid may be contained within a substantially particle free environment, which may be maintained (e.g., by introducing ultra-clean gas, ultra-clean non-reactive gas, etc.) adjacent to the front face and the back face as the liquid is being removed. The method further comprises introducing a mixture comprising a carrier gas and a cleaning enhancement substance (e.g., a polar organic compound, helium, a surfactant, carbon dioxide, etc.). The cleaning enhancement substance, which may be present in a trace amount, may dope the liquid on the front and back faces in a manner resulting in a concentration gradient of the cleaning enhancement substance in the liquid on the surface (s) of the wafer to accelerate fluid flow of the attached liquid off of the water.

Another aspect of the invention provides an apparatus for cleaning a semiconductor wafer. The apparatus includes a vessel adapted to immerse a wafer in a liquid comprising water. The wafer includes a front face, a back face and an edge. The apparatus also includes a first control valve operably coupled to the vessel, and adapted to provide a substantially particle free environment adjacent to the front face and the back face as the liquid is being removed. A second control valve operably coupled to the vessel also is provided. The second control valve is adapted to introduce a carrier gas comprising a cleaning enhancement substance. The cleaning enhancement substance dopes the liquid which is attached to the front face and the back face to cause a concentration gradient of the cleaning enhancement substance in the attached liquid to accelerate fluid flow of the attached liquid off of the wafer.

A further alternative embodiment provides an apparatus for holding a plurality of substrates. The apparatus includes a lower support. The lower support comprises a plurality of first ridges, where each of the first ridges provides a support for a lower substrate portion. The apparatus also includes an upper support. The upper support comprises a plurality of second ridges, where each of the second ridges provides a support for an upper substrate portion. The lower substrate portion and the upper substrate portion are defined on a substrate. The first ridges and the second ridges draw liquid from the substrate.

A further understanding of the nature and advantages of the invention may be realized by reference to the latter portions of the specification and attached drawings.

BRIEF DESCRIPTION OF THE DRAWINGS

FIG. 15A and 15B are graphical comparisons of results obtained when a method according to the invention is used to clean and dry a semiconductor wafer to results obtained using another method to clean and dry a semiconductor wafer.

DETAILED DESCRIPTION

Figure 1:
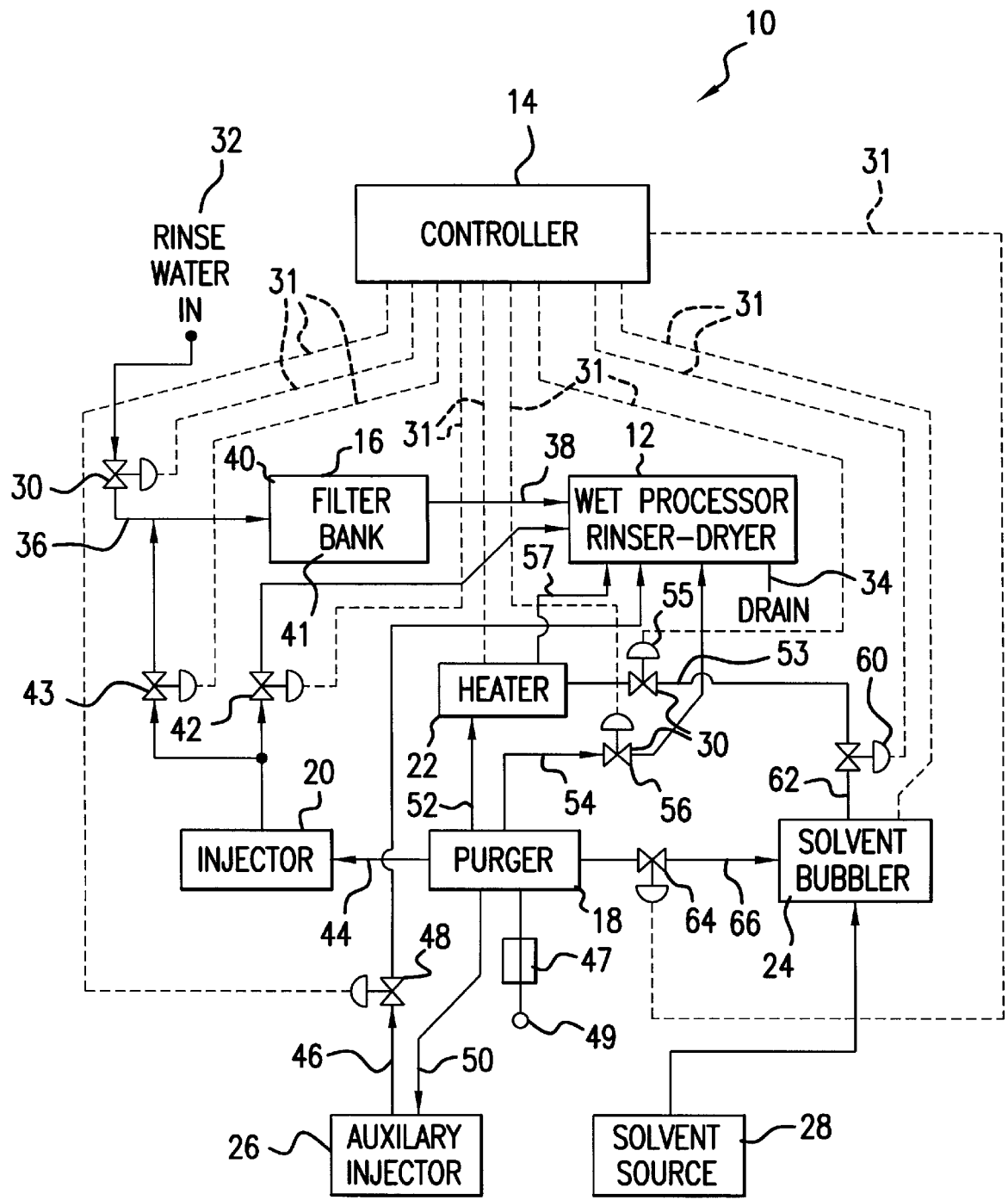
FIG. 1 is a simplified block diagram of an embodiment of a wet processing system according to the invention.

FIG. 1 illustrates in block diagram form an embodiment of a wet processing system 10 according to the invention. A wet processing system 10 includes elements such as a wet processor 12, a controller 14, a filter bank 16, a purger 18, an injector 20, a heater 22, a solvent bubbler 24, an auxiliary injector 26, and a solvent source 28. The system 10 also includes a plurality of flow control valves 30. Each of the flow control valves 30 is operably coupled to the controller 14 and at least one of the aforementioned elements, as shown by dashed lines 31. The solid lines represent lines used to transfer fluids between each of the system elements. A rinse water source 32 and drain 34 are also shown.

Rinse water enters the system 10 at the rinse water source 32. A control valve at the rinse water source 32 controls the flow of rinse water via the controller 14, operably coupled to the control valve 30. The rinse water can be, for example, filtered liquid such as deionized (DI) water. Other liquids can be used as the rinse water. Typically the DI water originates from a DI water pad, often outside a wafer fabrication plant.

The filter bank 16 can be any suitable combination of filters, typically used for point-of-use applications. The filter bank 16 connects to the rinse water source 32 through a line 36 and connects to the wet processor 12 through a line 38. The filter bank 16 includes an ion exchange module 40 and a combination of charged and neutral filters 41, among others. Examples of charged filters that can be used with the invention are described and illustrated in U.S. patent application Ser. No. 08/285,316 filed Aug. 3, 1994, entitled METHOD AND APPARATUS FOR DELIVERING ULTRA-LOW PARTICLE COUNTS IN SEMICONDUCTOR MANUFACTURING (hereinafter "ULTRA-LOW PARTICLE COUNTS"), which is incorporated by reference herein for all purposes. The filter bank 16 provides point-of-use ultra-purified DI water. The ultra-purified water is substantially free from particles greater than about 0.5 microns in diameter, and preferably greater than about 0.2 microns in diameter, and more preferably greater than about 0.1 microns in diameter.

The filter bank 16 also provides for a nominal pressure drop therethrough. The pressure drop is less than about 15 pounds per square inch, and preferably less than about 5 pounds per square inch. A higher flow rate is achieved through the filter bank 16 without auxiliary pumps or flow/pressure enhancing devices. Of course, other filters capable of providing ultra-purified water for point-of-use applications can be used depending upon the application.

The injector 20 can be any suitable injector for reducing or preferably eliminating metal contaminants from lines and system elements. Preferably, the injector 20 is a conventional aqueous hydrochloric or hydrofluoric acid injector. An example of an injector that can be used with the invention is discussed in ULTRA-LOW PARTICLE COUNTS. The injector 20 connects to the wet processor 12. A control valve 42 meters the acid into the wet processor 12, and a control valve 43 meters the acid into the filter bank 16. Preferably, the controller 14 meters acid into the system elements such as the wet processor 12 and the filter bank 16, among others, during system maintenance, and other desirable times. The injector 20 also connects via line 44 to the purger 18. The purger 18 provides clean pressurized gas or gases (hereinafter, referred to simply as "gas") to the injector 20 to allow acid to be introduced into the aforementioned system elements without other auxiliary devices. Of course, the type of injector 20 used depends upon the particular application.

Another chemical such as a solvent, hydrogen peroxide, surfactant, cleaning solution, or the like is optionally introduced through the auxiliary injector 26. The auxiliary injector 26 connects to the wet processor 12 through a line 46, and is controlled by a control valve 48 operably coupled to the controller 14. A purger 18 supplying pressurized gas also connects to the auxiliary injector 26 through a line 50. An example of an auxiliary injector that can be used with the invention is also discussed in ULTRA-LOW PARTICLE COUNTS. Of course, the type of auxiliary injector 26 depends upon the particular application.

A further system element is the purger 18, often used to supply gas and/or a pressure head to certain system elements such as the wet processor 12 and others. The purger 18 can be any suitable type of pressure reduction and/or control means capable of supplying the source gas to certain system elements at the desired pressure and flow rate. An example of a purger 18 that can be used with the invention is described in ULTRA-LOW PARTICLE COUNTS. The purger 18 connects to a gas source 49, which is often a carrier gas used in the wet processing system 10.

Purger 18 also couples to filter 47 before the gas source 49. The filter 47 is capable of high flow rates, e.g., 1500 standard liters/minute and greater. Filter 47 may also have a retention rating at 0.003 microns. Preferably, no less than about 99.9999999% of particles are removed by way of filter 47. The filter 47 is coupled between the external gas supply facilities and wet processing system 10. The filter 47 is located before or immediately before the wet processing system 10. In one embodiment, the filter 47 is attached to the wet processing system 10, but also can be at other locations. The filter 47 provides for a substantially particle-free gas environment. That is, after passing through the filter 47, the gas is preferably substantially free from particles greater than about 0.2 microns in diameter, or more preferably greater than about 0.1 microns in diameter, or even more preferably greater than about 0.05 microns in diameter, or still more preferably greater than about 0.025 microns in diameter, or most preferably greater than about 0.01 microns in diameter. Commercially available filters that can be used to embody the filter 47 are, for example, Waferguard T-Line Cartridge Filters. Of course, other filters can be used, depending upon the application.

Preferably, the carrier gas is an ultra-purified or electronic grade nitrogen gas, or any suitable carrier gas capable of carrying a cleaning enhancement substance (e.g., a trace of polar organic compound, etc.) into the wet processor 12 at a desired temperature, pressure, and flow rate. Using a carrier gas having a high purity level minimizes or prevents contamination of the system elements of the wet processing system 10. The carrier gas may be ultra-clean and/or substantially free from particles greater than about 0.1 microns in diameter and preferably greater than about 0.05 microns in diameter. As previously noted, the purger 18 also supplies pressurized carrier gas to the injector 20 and auxiliary injector 26 through lines 44 and 50, respectively. The purger 18 also supplies gas to the wet processor 12, through one of several alternative routes.

In one typical route, the purger 18 is connected to the wet processor 12 through the heater 22 via lines 52 and 57. In this route, the gas can be heated at the heater 22 before entering into the wet processor 12 through the line 57. The heater 22 can be any suitable commercially available or custom made heater capable of heating the gas (e.g. nitrogen) to a temperature at the wet processor 12 greater than 70° F. and preferably greater than 150° F., but no greater than 250° F.

The controller 14 is operably coupled to the heater 22 to adjust the temperature of the gas, and turn the gas on and off at the desired times. Preferably, however, the gas is at room temperature, and is not heated. The controller 14 also meters the gas into the wet processor 12 at a desired flow rate and time.

Alternatively, the heated gas (a carrier gas) connects to the solvent bubbler 24 through a line 53, before entering the wet processor 12. The heated gas mixes and dilutes solvent from the solvent bubbler 24 before entering the wet processor 12. The controller 14 is operably coupled to a control valve 55 to meter the heated carrier gas to the wet processor 12.

Another alternative route connects the purger 18 directly to the wet processor 12 through a line 54. The controller 14 is operably coupled to a control valve 56 to turn the gas on and off at the desired times. The controller 14 and the control valve 56 also meter the gas into the wet processor 12 at a desired flow rate and time.

In a further alternative route, the purger 18 connects to the solvent bubbler 24 through a line 58 before entering the wet processor 12. In this route, the carrier gas mixes with solvent (a cleaning enhancement substance) from the solvent bubbler 24 before entering the wet processor 12. The controller 14 is operably coupled to a control valve 60 that meters the carrier gas to the wet processor 12 through line 58. In one embodiment, the carrier gas contains a trace of polar organic solvent. This carrier gas contains a cleaning enhancement substance which increases fluid flow and cleans off objects to be cleaned. Of course, the use of any of these configurations or combinations of such configurations depends upon the particular application.

The controller 14 can be any suitable microprocessor-based programmable logic controller, personal computer controller, or the like for process control. A suitable controller includes features such as programmability, reliability, flexibility, and durability from corrosive elements. The suitable controller includes various input/output ports used to provide connections to open and close valves, and regulate and meter fluids, among other features. The controller 14 also includes sufficient memory to store process recipes for desired applications. An example of a suitable controller that can be used with the invention is described in ULTRA-LOW PARTICLE COUNTS. Of course, the type of controller used depends on the particular application.

The solvent bubbler 24 supplies a carrier gas comprising a trace amount of polar organic compound (a cleaning enhancement substance) to the wet processor 12 through line 62. Preferably, the cleaning enhancement substance is a trace of solvent. The purger 18 supplies a carrier gas to the solvent bubbler 24 through line 66. To regulate or meter the flow of the solvent into the wet processor 12, the controller 14 is operably coupled to a control valve 64 that is connected to the line 66, which is, in turn, attached to the solvent bubbler 24. The system 10 also provides the solvent source 28, such as a bottle or canister of the desired chemical.

Figure 2:
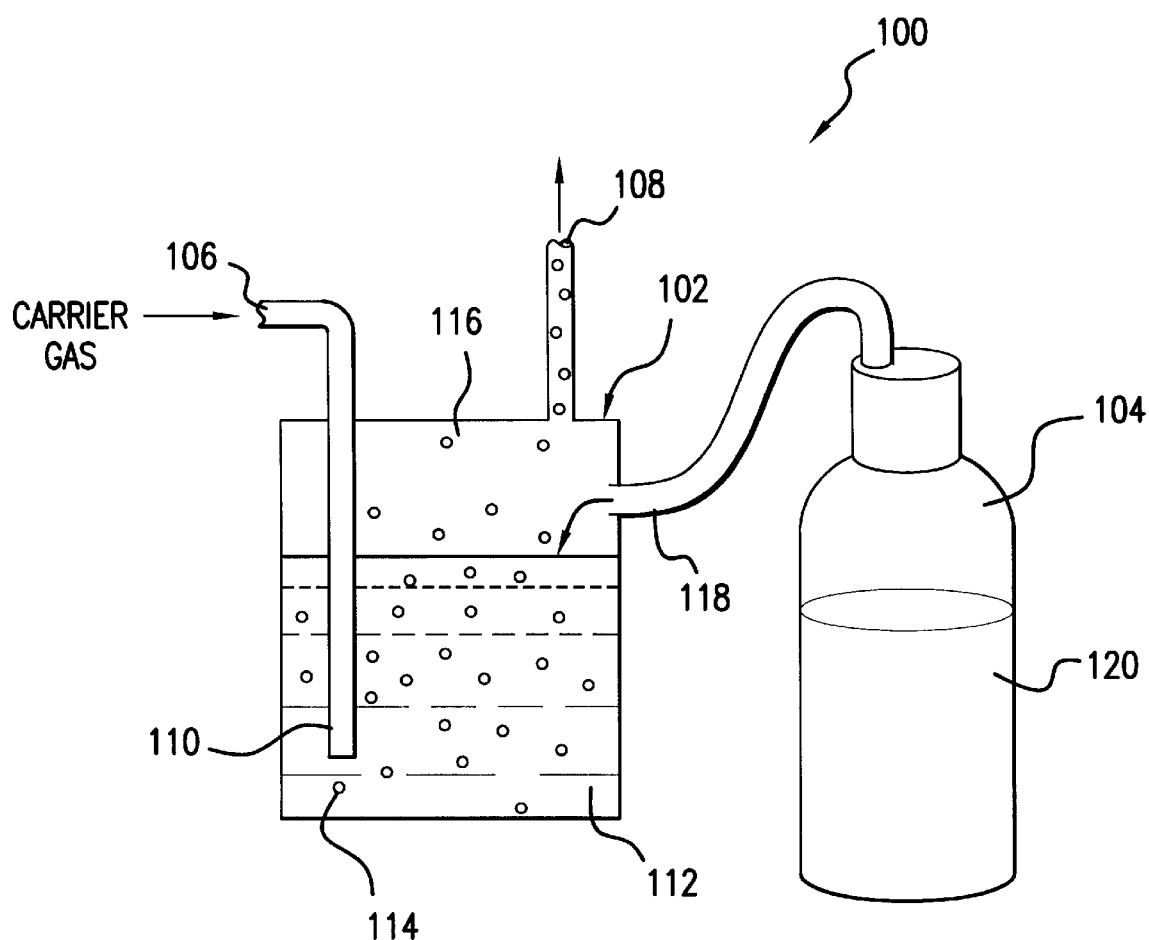
FIG. 2 is a simplified cross-sectional view of a solvent bubbler according to the invention.

The solvent bubbler 24 can be any suitable solvent bubbler system for use with the wet processor 12, carrier gas, and solvent. An example of a solvent bubbler system that can be used with the invention is represented by the simplified illustration of FIG. 2. The solvent bubbler system 100 includes a solvent bubbler vessel 102 and a solvent source 104. The solvent bubbler vessel 102 connects to a carrier gas source at an inlet 106. A sparger 110 sparges carrier gas 114 as bubbles into the solvent 112 at a lower portion of the solvent bubbler vessel 102. As the carrier gas bubbles float up through the solvent, the carrier gas bubbles accumulate with solvent. Carrier gas bubbles with solvent escape into the vapor head space 116 of the solvent bubbler vessel 102, and exit the solvent bubbler vessel 102 through outlet line 108. This carrier gas with solvent generally behaves according to ideal gas laws or the like. A solvent fill inlet 118 also is connected to the solvent bubbler vessel 102. A solvent source 104 and solvent 120 are further shown. Alternatively, the solvent can be introduced into the carrier gas by mechanical means, e.g., ultrasonic, megasonic, atomizer or nebulizer, etc.

Figure 3:
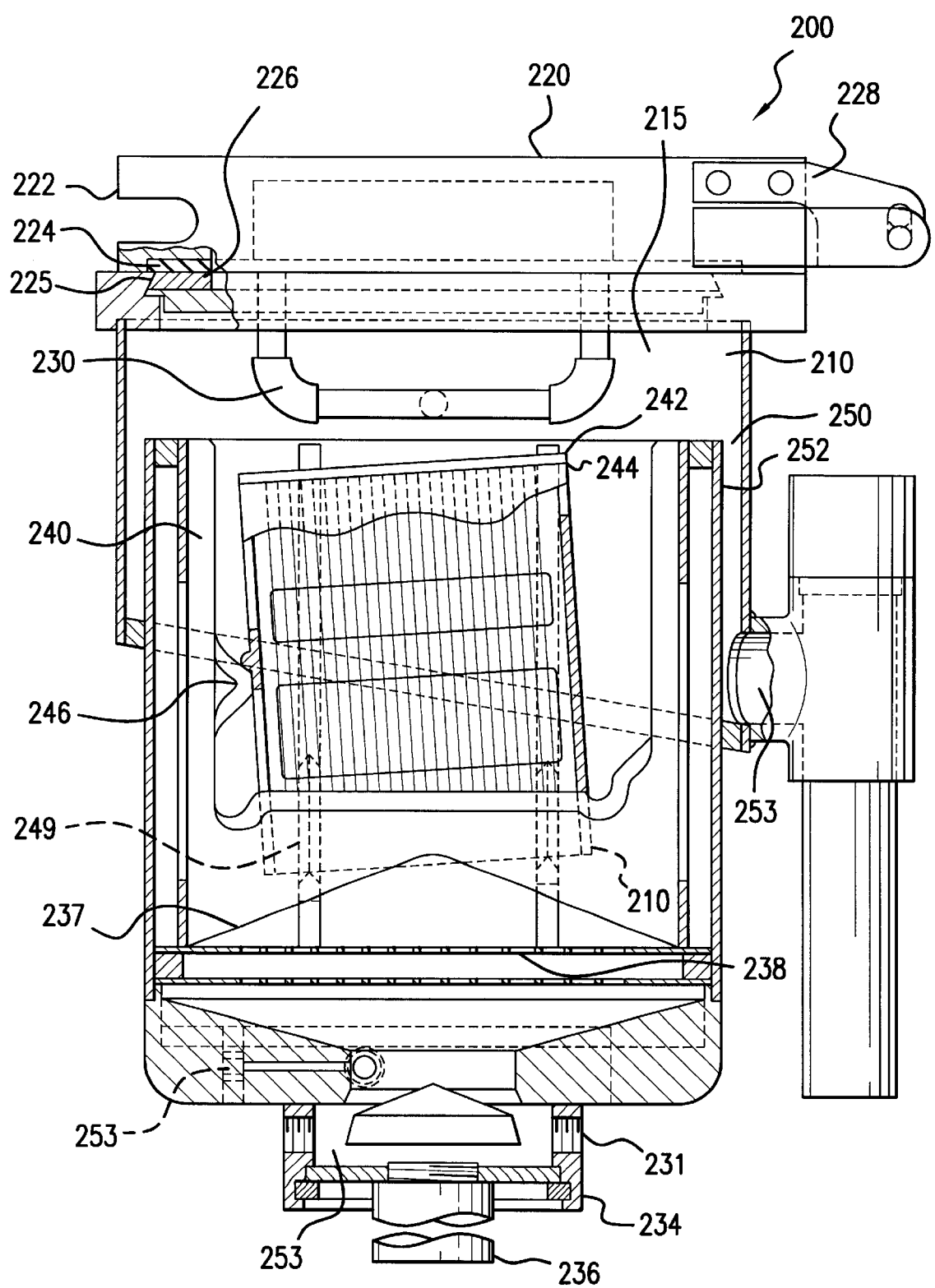
FIG. 3 is a simplified cross-sectional side-view of an embodiment of a wet processing chamber in accordance with the invention.

FIG. 3 is a simplified cross-sectional side view of a wet processing chamber 200 according to an embodiment of the invention. The wet processing chamber 200 includes a main chamber 210, a lid 220, a lower drain region 231, and other elements. The main chamber 210 includes the process region 240 (or lower chamber region) and upper chamber region 215. A cascade drain region 250 also is shown. Of course, other chamber elements also may be present depending upon the particular application.

The lid 220 is preferably a sealed lid. The sealed lid includes a handle 222, O-ring type seal 224, a compression ring 226, a hinge 228 and a gas inlet 230, among other features. The compression ring 226 provides outward force onto a horizontal portion 225 of the main chamber housing to seal the contents of the main chamber 210. The O-ring type seal 224 provides a horizontal seal between vertical surfaces of the lid 220 and main chamber housing. The gas inlet 230 includes at least a carrier gas inlet and solvent gas inlet. Of course, the exact configuration of the gas inlet 230 depends upon the particular application.

The process region 240 includes a substrate carrier 242, side substrate carrier support 246, bottom substrate carrier support 248 and substrate support 249. As will be described in greater detail below, the substrate carrier 242 and substrate support 249 are configured and arranged to minimize liquid accumulation as liquid is drained away in the drying process.

In a specific embodiment, the substrate carrier 242 is a wafer boat or alternatively a half wafer boat or any other type of substrate carrier 242 with a lower profile than a wafer boat. The half wafer boat or lower profile boat holds or accumulates less liquid than its full boat counterpart, and therefore drains liquid faster and more easily. The carrier 242 includes substrates (e.g., wafers) 244 disposed within the supports of the carrier 242. The carrier 242 is supported by a side substrate carrier support 246 and bottom substrate carrier support 248. The side substrate carrier support 246 holds the substrate carrier 242 in place, and prevents such substrate carrier 242 from excessive movement. As shown, the bottom substrate carrier support 248 tilts the substrate carrier 242 at a slight angle from a horizontal (as viewed in FIG. 3) position. The angle tends to prevent substrates from sticking to each other during certain rinse and dry operations, as explained further below. The angle from the horizontal position ranges from about 20 to about 15°, and is preferably determined by the characteristics of the particular carrier 242. By keeping each of the substrates separated, liquid does not accumulate therebetween, thereby decreasing the amount of liquid and therefore particles that accumulate on the substrate.

Each substrate carrier support includes a contact point on the substrate carrier 242 to drain liquid such as water from the substrate carrier surface. The contact point is typically a knife edge, serrated edge, or any other shape that breaks the surface tension of the liquid on the substrate carrier surface. By breaking the surface tension of the liquid on the substrate carrier 242, the liquid with particles drains (or "wicks") off of the substrate carrier 242 more easily. Removing the liquid with particles from the substrate carrier 242 tends to promote drying and rinsing of each of the substrates in a particle-free manner.

The substrate support 249 provides lift and a contact point for each of the substrates 244 within the substrate carrier 242. To more easily appreciate the features of the substrate support 249, it should be noted that each of the substrates in a conventional substrate carrier touches the substrate carrier in at least three large regions. Each of the substrates is also relatively close to the insides of the substrate carrier. Accordingly, liquid easily accumulates and is often trapped on edges of each of the substrates.

To reduce this effect, the substrate support 249 lifts the substrates 244 in the substrate carrier 242 by elevating each of the substrates 244 in the substrate carrier 242 with a knife edge. By lifting each of the substrates in the substrate carrier 242, the substrate edges are further away from the insides of the substrate carrier 242, thereby allowing liquid to flow freely from the region between the substrate edges and carrier 242 insides. To further promote the removal of liquid from each of the substrates, the knife edge is preferably pointed, serrated, or any other shape that easily breaks the surface tension of the liquid at the bottom of each substrate 244. By breaking the surface tension of liquid at the substrate bottom edges, liquid flows freely from the substrate bottom edges, thereby reducing the meniscus at such edges. The knife edge lifts each of the substrates at least about 2 mm from the bottom insides of the substrate carrier 242, and preferably lifts each of the substrates about 5 mm, but no more than about 20 mm. The substrate carrier 242 support removes liquid such as water from the substrates 244, thereby decreasing the amount of water and, consequently, the number of particles that can be deposited on the substrates 244.

To add and drain liquid into the main chamber 210, and, in particular, the process region 240, the lower drain region 231 includes a fill inlet 232 and drain valve 236. The fill inlet provides liquid such as DI water and the like into the process region 240. The drain valve 236 removes liquid from the process region 240 through the drain outlet 236. A plurality of drain holes 238 also exist at the bottom of the main chamber 210 in the process region 240 to distribute the liquid evenly therethrough. The lower drain region also includes an angled drain floor 237 at the bottom of the main chamber 210 to facilitate liquid transfer, and a flat support surface 239 in the process region 240 to support the substrate carrier support.

A cascade region 250 allows liquid to cascade out into cascade drain region 253. To rinse certain chemicals from the substrate carrier 242 and substrates 244, ultra-purified DI water enters through the fill inlet 237, rises through the drain holes 238, flows through the process region 240, and cascades over a partition 252 into the cascade drain region 253. This sequence of steps removes excess chemicals such as acids or the like from the substrate carrier 242 and substrates 244, and also keeps such chemicals from accumulating in the main chamber 210 and in particular the process region 240.

Figure 4:
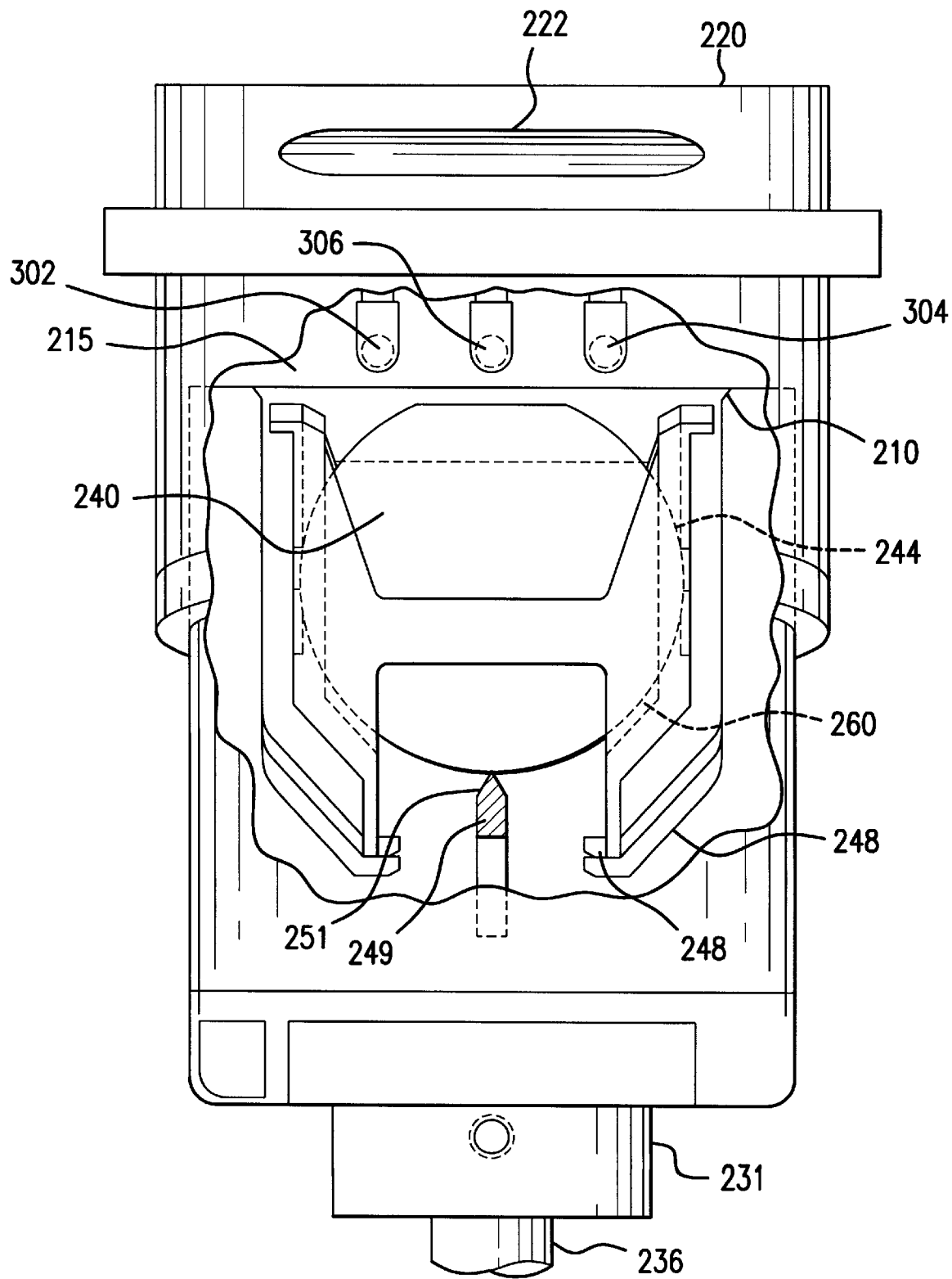
FIG. 4 is a simplified cross-sectional view of an embodiment of a wet processing chamber in accordance with invention.

FIG. 4 illustrates a simplified front view of the wet processing chamber 200. Like elements in FIGS. 3 and 4 are designated with the same numerals. The front view of FIG. 4 shows elements such as the main chamber 210, the lid 220, the lower drain region 231 and the process region 240, among others. The main chamber 210 includes the process region 240 and upper chamber region 215.

As shown, the substrate support 249 lifts each of the substrates 244 from the substrate carrier 242 to form a gap 260 between the edges of the substrate and the insides of the substrate carrier. The gap 260 prevents liquid from accumulating between such substrate edges and the insides of the substrate carrier 242. The gap 260 is no greater than about 20 mm, but is larger than about 2 mm. The substrate support is a knife edge with triangular point 251. Other shapes may also be used to break the meniscus at the bottom of the substrate edges and remove water therefrom. The meniscus often forms at the bottom substrate and surface edges as liquid is being removed from the substrates. As previously noted, the meniscus often contains particles that can be detrimental to the manufacture of an integrated circuit.

FIG. 4 also shows the bottom substrate carrier supports 248. As shown, the bottom substrate carrier supports 248 have different heights, typically lower to higher from one side of the process region 240 to the other side of the process region 240. The different heights of the bottom substrate carrier supports 248 tilt the position of the substrate carrier 242 from horizontal (as viewed in FIG. 4). The tilt or angle of the substrate carrier 242 also tilts the substrates 244, thereby preventing the substrates from sticking to each other during certain rinse and dry operations.

FIG. 4 further shows certain gas inlets 302, 304 and 306. Each of the gas inlets 302, 304 and 306 is a distribution plenum with a plurality of holes for distributing gas evenly over the process region 240. In the embodiment shown in FIG. 4, the wet processing chamber 200 includes two outside gas inlets 302 and 304, and a center carrier gas inlet 306. The two outside gas inlets 302 and 304 generally introduce an ultra-pure, non-reactive (e.g., non-oxidizing, non-reactive, inert, etc.) gas into the wet processing chamber 200. In some embodiments, the two outside gas inlets 302 and 304 provide ultra-pure nitrogen to purge the main chamber 210 from the environment, thereby creating an ultra-clean (e.g., substantially free from particles) main process region 240. In these embodiments, the nitrogen gas (or absence of oxygen gas) is necessary or even critical to prevent the formation of oxidation on the substrate, e.g., semiconductor wafer. The center gas inlet 306 introduces the carrier gas comprising the cleaning enhancement substance. The non-reactive gas (e.g., nitrogen) mixes with the carrier gas comprising cleaning enhancement substance in the chamber 210. By introducing an ultra-pure, non-reactive gas and carrier gas, the chamber may be kept substantially free from particles greater than about 0.2 microns in diameter, and preferably substantially free from particles greater than about 0.1 microns in diameter, thereby creating an ultra-pure and ultra-clean environment. Of course, the number of gas inlets and their use depend upon the particular application.

Figure 5:
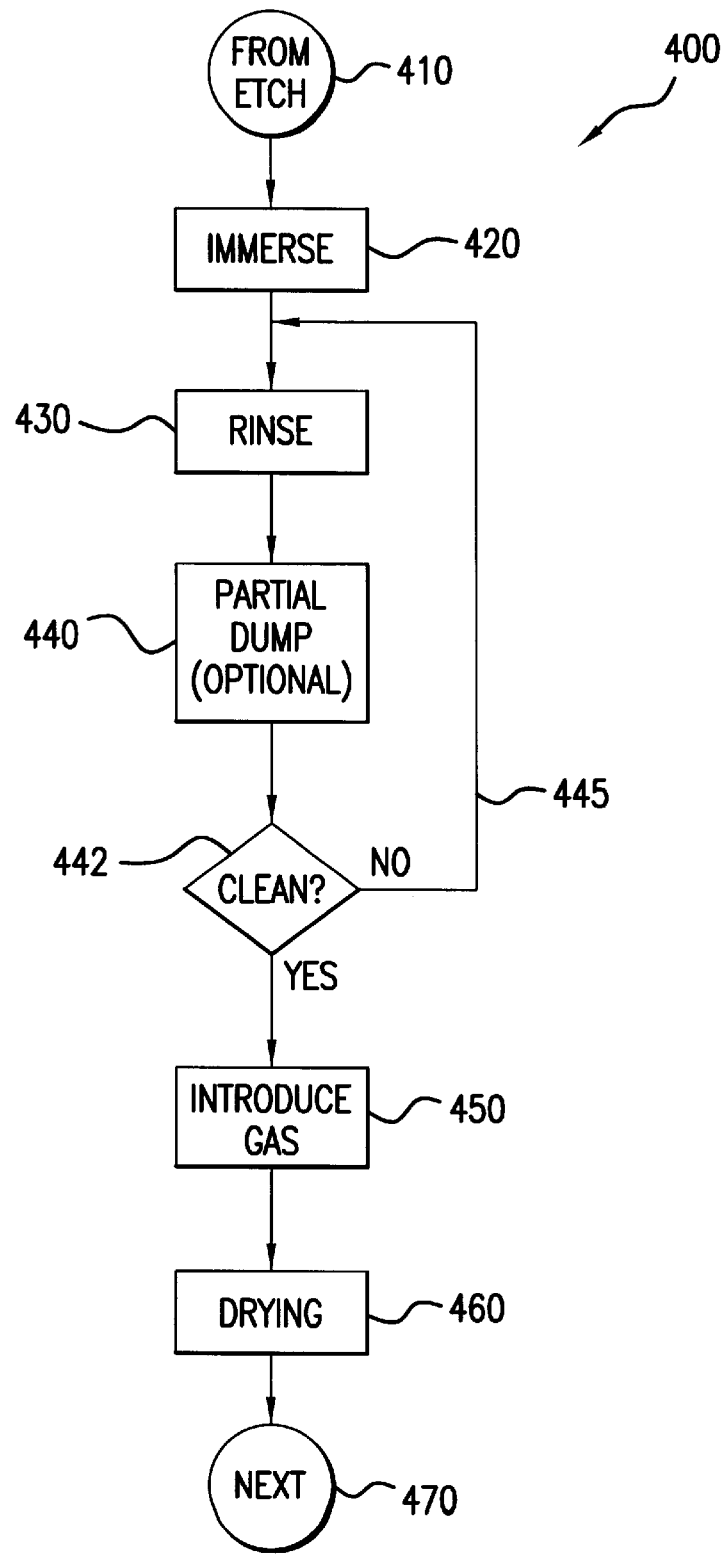
FIG. 5 is a simplified flow diagram of an embodiment of a wet processing method according to the invention.

FIG. 5 is a simplified flow diagram of a wet processing method 400 according to an embodiment of the invention. The rinse method is illustrated for a recently wet-etched substrate. The wet-etched substrate, for illustrative purposes, is etched in a solution of hydrofluoric (HF) acid or buffered hydrofluoric (BHF) acid. Hydrofluoric acid is often used to remove oxides from surfaces of a semiconductor wafer. The method shown in FIG. 5 is merely an example of a method according to the invention and should not be taken as limiting the scope of the invention.

In step 410, the method 400 begins by receiving a recently etched substrate (e.g., etched wafer) from a dilute HF acid etch. The etched substrate has no oxide layer formed thereon from the HF acid etch, and is predominantly hydrophobic in characteristic. A step 420 of immersing the etched substrate in a bath of ultra-purified DI water follows. The etched substrate is immersed into the DI water very shortly after the acid bath, i.e., in about 5.0 seconds or less, and preferably about 2.5 seconds or less.

The step of immersing the etched substrate nearly immediately into the DI water substantially prevents formation of silicon dioxide from the oxygen in air, and promotes the formation of a thin and clean high grade silicon dioxide layer from the ultra-purified DI water. The DI water is substantially free from particles and therefore forms a substantially particle-free silicon dioxide layer. The DI water can be at room temperature (e.g., 20° C.) or an elevated temperature, e.g., 25° C., 30° C., 40° C., 45° C., etc.

To remove acid such as HF acid from the surface of the substrate, in step 430, the ultra-purified DI water in the main chamber (or vessel) flows across the substrate and cascades over into a drain. The DI water cascade carries excess acid into the drain and reduces the acid concentration in the vessel.

Optionally, the DI water in the vessel may be removed by dumping it (step 440) into a bottom drain dump. Preferably, the dumping step is a partial dump, and not a complete dump or removal of DI water. During the removal of the DI water, an ultra-pure gas (non-reactive) replaces the DI water. Typical gases include, for example, filtered nitrogen, argon, helium and deoxygenated air. The gases are typically filtered before use. The filtered gas also is ultra-clean, i.e., substantially free from particles.

After replacing the DI water with the clean gas, clean DI water from the DI water source flows into the main chamber to cover the surfaces of the substrate. The aforementioned steps may be repeated (branch 445) alone or in any combination until substantially no residual acid (step 442) remains on the substrate.

When residual acid has been substantially removed from the substrate, a carrier gas, including a cleaning enhancement substance (e.g., trace amount of polar organic compound, helium, carbon dioxide, etc.), is introduced (step 450), and mixes with ultra-pure, non-reactive gas and replaces the DI water to clean the substrate. In one embodiment, the trace amount of polar organic compound in the gases includes a concentration of less than about 1,000 ppm and, in another embodiment, less than about 500 ppm. The polar organic compound also can have other concentrations, but is generally not saturated or superheated. The carrier gas is preferably ultra-pure nitrogen, and the polar organic compound includes compounds such as, for example, isopropyl alcohol, di-acetone alcohol, 1-methoxy-2-propanol. The carrier gas is also substantially free of particles of about 0.20 microns in diameter or less, more preferably about 0.15 microns in diameter or less, and most preferably about 0.10 microns in diameter or less. For a typical batch of substrates in a conventional substrate boat, the amount of polar organic compound used is preferably less than a milliliter.

The mixture of carrier gas containing a trace amount of polar organic compound is made by bubbling carrier gas into a liquid solution of polar organic compound. In particular, the mixture is made by flowing cold or hot nitrogen (preferably nitrogen at ambient temperature) through a solution of polar organic compound at a rate of about 3 cubic feet/min. or less. The carrier gas comprising the polar organic compound then mixes with either cold nitrogen at a flow rate of about 5 cubic feet/min. or less, or hot nitrogen at a flow rate of about 10 cubic feet/min. or less. A temperature of such hot nitrogen carrier gas is about 70° F. or higher, but not greater than 250° F., and is preferably kept below about 185° F. By mixing nitrogen gas with the carrier gas comprising the polar organic compound, the polar organic compound is substantially dilute (or, a non-saturated vapor) in the main chamber.

The mixed carrier gas, including the polar organic compound and non-reactive gas, comes in contact with the DI water on the substrate, which is being drained off at a slow rate. This tends to remove particles from the substrate. A carrier gas, including isopropyl alcohol, 1-methoxy-2-propanol, di-acetone alcohol or other polar organic solvents mixed with non-reactive gas, replaces the DI water which drains from the processor (or vessel) at a rate of about 5.0 mm/sec or less, preferably about 4 mm/second or less and more preferably at a rate of about 1 mm/second or less.

The polar organic compound is believed to remove a substantial portion of the liquid on the substrate surface through a concentration gradient or mass transfer effect, commonly termed "Marangoni effect." This effect tends to increase the flow of liquid from the substrate surface through use of a solvent or any cleaning enhancement substance, but does not remove all liquid from the substrate surface. It is generally believed that the trace of polar organic compound in the gas changes the angle of the liquid meniscus on the substrate face to reduce surface tension of the liquid attached to the substrate face, thereby increasing fluid flow therefrom. It is also generally believed that the polar organic compound dopes the liquid attached to the substrate face to cause a concentration gradient of the polar organic compound in the attached liquid to accelerate fluid flow of the attached liquid off of the substrate face. In particular, the polar organic compound forms a concentration gradient along a boundary layer of liquid attached to the substrate surface, which facilitates the fluid flow therefrom. This fluid flow pulls or draws off particles from the substrate face. These particles are greater than about 0.5 microns in diameter or preferably 0.2 microns in diameter or more preferably 0.1 microns in diameter. Preferably, the carrier gas also is not heated but is at room temperature, e.g., 18 to 22.5° C.

In certain embodiments, a thin boundary layer of liquid can remain on the substrate surface after liquid is removed from the chamber. This boundary layer can have a thickness of about 1,000 Å or less and preferably has a thickness of about 500 Å or less, and more preferably has a thickness of about 100 Å or less. In one embodiment using isopropyl alcohol as the polar organic compound, the boundary layer has a thickness of about 500 Å or less. In an embodiment using 1-methoxy-2-propanol, the boundary layer may have a thickness of about 100 Å or less. A further drying step can be used to evaporate the boundary layer.

In alternative embodiments, the ultra-pure gas may be substantially free from any polar and/or non-polar organic compounds, reactive compounds, or the like. Like the previous embodiments, the gas replaces the DI water (step 450) being drained, removing water from the surface of the substrate, and also tends to remove particles from the substrate via the DI water. The gas replaces the DI water at a rate of about 2.50 mm/second or less as measured from the substrate face, and preferably at a rate of about 1.25 mm/second or less, and more preferably at a rate of about 0.60 mm/second or less. In such embodiments, the invention uses substantially no harmful solvents or the like, and is therefore even more safe, efficient, and economical.

A step of drying (step 460) is performed on the substrate and carrier for further drying, if necessary. The step of drying substantially removes all liquid droplets adhering to surfaces such as substrate edges, carrier edges, and the like. As is understood by one of ordinary skill in the art, drying may comprise evaporative drying. In one embodiment, drying occurs by pulse flow drying. The step of pulse flow drying occurs by way of high velocity flow apparatus 600 illustrated in FIGS. 6, 6A and 6B. The high velocity flow apparatus can be adapted into the wet processing chamber 200 among other systems. The high velocity flow apparatus 600 includes a plurality of nozzles 601 directed over a substrate carrier 242. The substrate carrier 242 includes a plurality of substrates 244, each having residual amounts of liquid at their edges. Each substrate 244 may have thereon a liquid volume ranging from about 1.0 milliliter to about 0.2 milliliter, but preferably less than about 0.5 milliliter. The plurality of nozzles 601 are defined by a first set of nozzles 603 (first nozzle set), a second set of nozzles 605 (second nozzle set), and others.

The first nozzle set 603 is directed to the front side 607 of the substrates 244. The first nozzle set 603 directs drying fluid at a substrate edge 609 adjacent to the substrate carrier sides 246. The drying fluid can be any suitable fluid capable of removing liquid from the substrate edges and substrate surfaces. The drying fluid is preferably ultra-pure nitrogen and the like, but may also be a variety of other gases or gaseous mixtures. The first nozzle set 603 preferably includes at least two nozzles, each placed at a location to direct drying fluid towards the substrate edge 609 adjacent to the substrate carrier sides. In the first nozzle set 603, a first nozzle 611 (A1) is directed to the substrate edges 609 at one side of the substrate carrier 242, and a second nozzle 615 (A2) is directed to the substrate edges 609 at the other side of the substrate carrier 242.

The second nozzle set 605 is directed to the back side 619 of the substrates 244. The second nozzle set 605 directs drying fluid at substrate edges 609 adjacent to the substrate carrier sides 246. The second nozzle set 605 preferably includes at least two nozzles, each placed at a location to direct drying fluid towards the substrate edges adjacent to the substrate carrier sides. In the second nozzle set, a first nozzle 621 (B1) is directed to the substrate edges at one side of the substrate carrier 242, and a second nozzle 625 (B2) is directed to the substrate edges at the other side of the substrate carrier 242.

Figure 6:
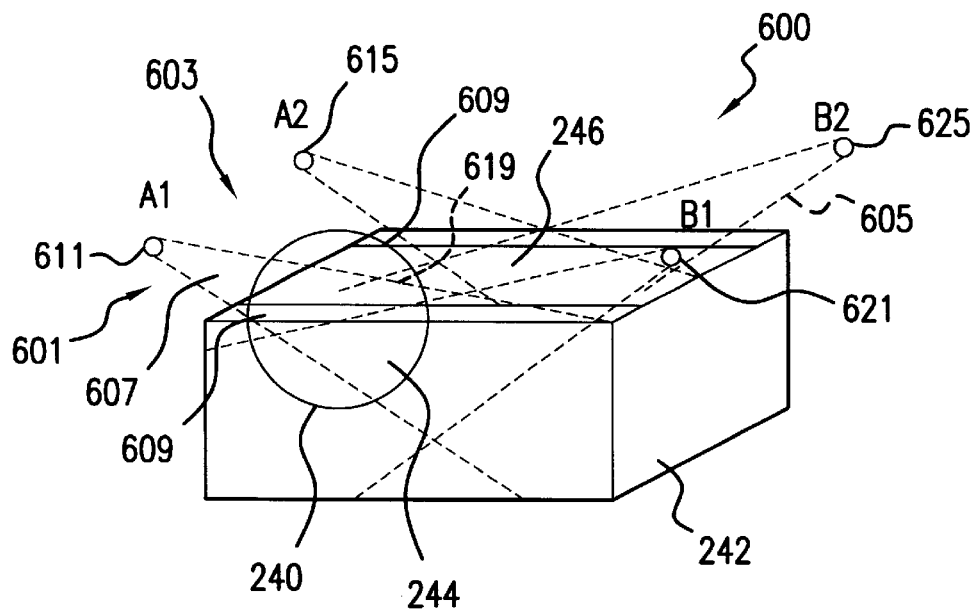
FIG. 6 is a simplified diagram of a high velocity flow apparatus according to the invention.
Figure 7:
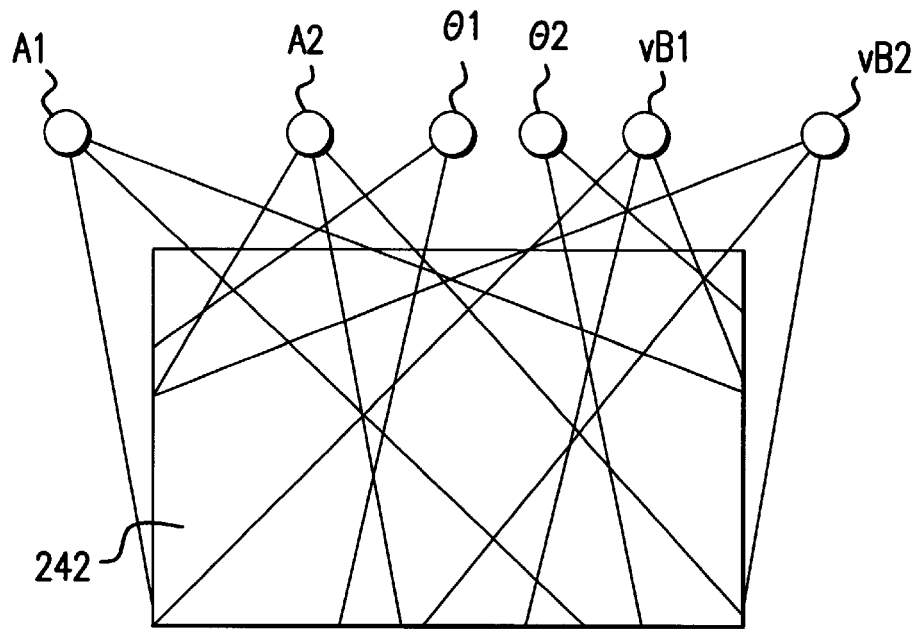
FIGS. 7 and 8 are simplified fluid diagrams of the high velocity flow apparatus of FIG. 6.
Figure 8:
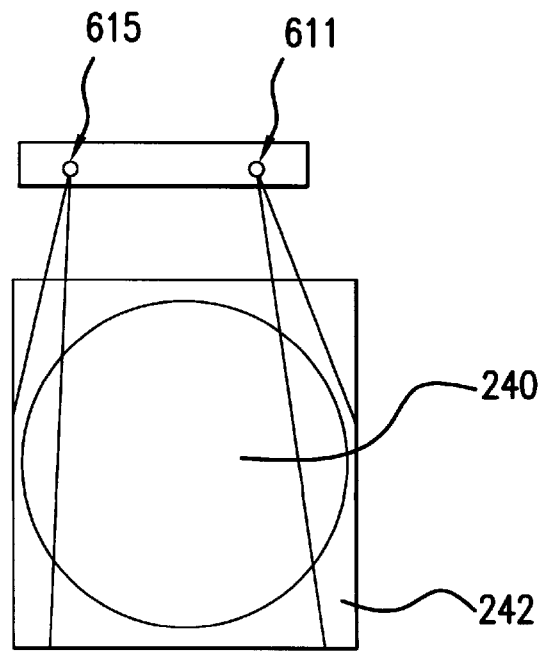

The nozzles can be any suitable nozzle capable of enabling the drying fluid to flow over the substrate edges and remove liquid therefrom as illustrated by fluid flow distribution patterns in FIGS. 7 and 8. FIG. 7 illustrates a simplified side-view diagram of the apparatus of FIG. 6 according to the invention. As shown, nozzles A1, A2, B2 and B3 direct drying fluid at the substrate edges (not shown) to preferably cover the inner surface area of the substrate carrier 242. Optionally, the apparatus can also include additional nozzles C1 and C2. Nozzles C1 and C2 are directed toward the substrate carrier front and back sides.

Figures 6A, 6B:
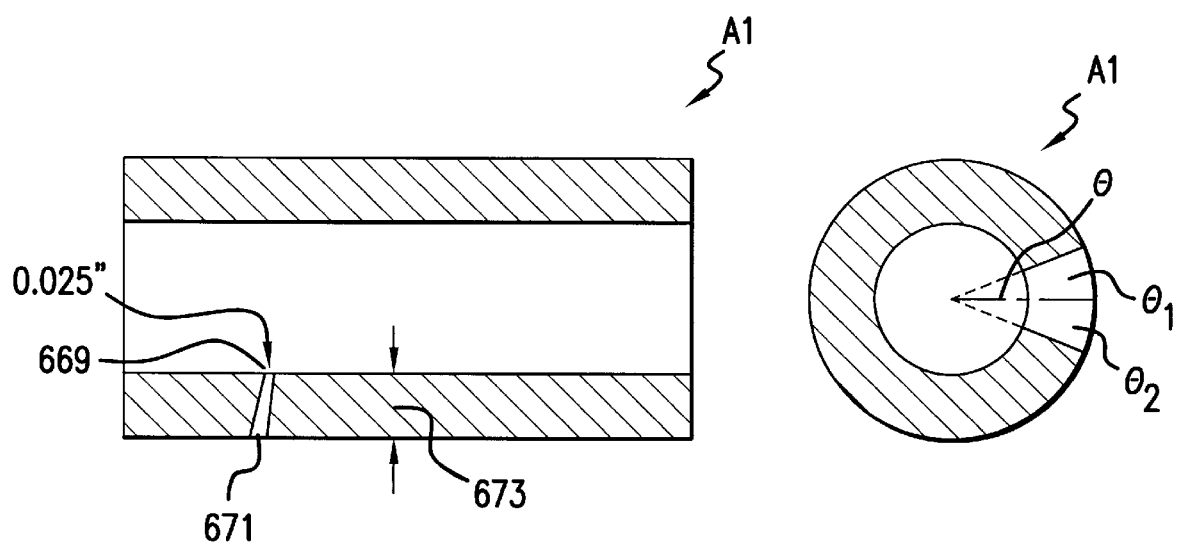
FIGS. 6A and 6B illustrate simplified diagrams of a nozzle according to the invention.

FIG. 8 illustrates a simplified front-view diagram of the nozzles A1 (611) and A2 (615) for the apparatus of FIG. 6 according to the invention. Nozzles A1 and A2 direct drying fluid at the substrate edges along a front portion of the substrates. The nozzles are preferably narrow and long to produce a fluid flow at high velocity to cover the desired number of substrates. Each nozzle produces a fluid flow of, for example, nitrogen gas ranging from about 250 to about 350 standard cubic feet per hour, and preferably about 300 standard cubic feet per hour. The pressure of the nitrogen gas at the nozzle opening ranges from about 80 to about 90 psia, and is preferably about 85 psia. The nozzle Al also includes an opening (FIG. 6A) having a width 669 of about 0.025 inches and a height 673 of about 0.375 inches as illustrated in FIGS. 6A and 6B. As shown, FIG. 6A illustrates a simplified cross-sectional side view of the nozzle A1, and FIG. 6B illustrates a simplified cross-sectional front view of the nozzle A1. As shown in FIG. 6B, the nozzle opening 671 includes an angle θ ranging from about 20 degrees to about 80 degrees, but is preferably about 75 degrees or less. The angle θ may also be defined by a first angle θ and second angle $\theta_2$. The first angle $\theta_1$ may be different from the second angle $\theta_2$ but can also be the same. Of course, other flow rates, pressures, and nozzle dimensions can be used depending upon the particular application.

Each nozzle is positioned to direct drying fluid to the substrate edges and portions of the substrate surface. Each nozzle is directed to an inner edge of the substrate carrier to promote the removal of liquid between the substrate edges and the carrier sides. Each nozzle outlet is located between about 0.5 inch to about 2 inches from an outside edge of the substrate carrier. Each nozzle is placed at an angle between about 5° to about 85°, and preferably about 45°, from a line perpendicular to the substrate surface. Of course, the exact angle used depends upon the particular application.

Drying occurs by directing drying fluid from the first nozzle set 603 and the second nozzle set 605 in an alternating sequence against the substrate edges and portions of the substrate surfaces. For example, the first nozzle set 603 sends a pulse of drying fluid against the substrate edges and portions of the front substrate surfaces, then the second nozzle set 605 sends a pulse of drying fluid from the opposite direction against the substrate edges and portions of the back substrate surfaces. The drying fluid pulses from the first nozzle set 603 and the second nozzle set 605 alternate until no more liquid remains on the substrate edges.

In removing water from the substrate edges, the second nozzle set 605 has a pulse duration which is longer than the pulse duration of the first nozzle set 603. When the substrate is a conventional semiconductor wafer, water adheres to the backside of the substrate and substrate edges with a greater attractive force than the front-side of the substrate. Accordingly, it is often preferable to have a pulse duration of the second nozzle set 605 which is at least two times longer than the pulse duration of the first nozzle set 603. The pulse duration of the second nozzle set 605 can also be three times longer or more than the pulse duration of the first nozzle set 603. The pulse duration of the first nozzle set 603 ranges from about 1 to 3 seconds and greater, and the pulse duration of the second nozzle set 605 ranges from about 2 to 6 seconds and greater. The number of pulses is preferably greater than 5 for each substrate side for a total of about 30 seconds of total pulsing time. Of course, other selected pulses among the first and second nozzle sets 603 and 605 may also be performed, depending upon the particular application.

Optionally, pulse flow drying is followed by flowing hot nitrogen gas over the substrate carrier. The hot nitrogen gas is ultra-pure nitrogen gas with a temperature of about 70° F. and preferably greater than about 150° F., but no greater than about 200° F. The combination of hot nitrogen gas and pulse flow drying reduces actual drying time by about one half, as compared to drying solely by means of hot nitrogen gas and the like. Alternatively, a drying gas such as nitrogen can be used alone to dry the substrate. Of course, other carrier gases and combinations thereof may also be used depending upon the particular application. The method 400 ends with the step 470 in which the next step in a semiconductor process is performed.

Figure 9:
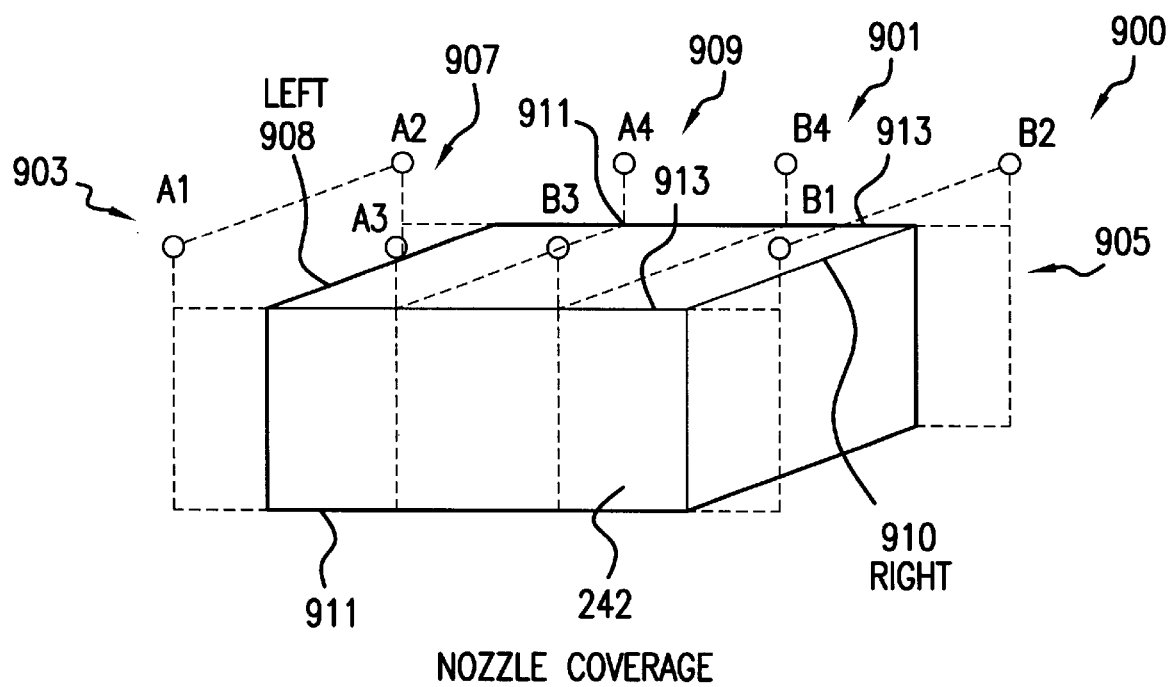
FIG. 9 is a simplified diagram of an alternative embodiment of a high velocity flow apparatus according to the invention.

FIG. 9 is a simplified diagram of an alternative embodiment of a high velocity flow apparatus 900 according to the invention. The high velocity flow apparatus 900 includes a plurality of nozzles 901 directed over a substrate carrier 242. The substrate carrier 242 includes a plurality of substrates 244, each having residual amounts of liquid at their edges. Each substrate may have a liquid volume thereon between about 1.0 milliliter to about 0.2 milliliter and preferably less than about 0.375 milliliter. The plurality of nozzles 901 is defined by a first set of nozzles 903 (first nozzle set), a second set of nozzles 905 (second nozzle set), a third set of nozzles 907 (third nozzle set), a fourth set of nozzles 909 (fourth set of nozzles), and others.

The nozzles 901 are placed at selected locations surrounding the substrate carrier, and, in particular, the substrates disposed in the substrate carrier. The first nozzle set 903 (A1, A2) is placed at an end 908 of the substrate carrier 242 facing the substrate faces, and the second nozzle set 905 (B1, B2) is placed at the other end 910 of the substrate carrier 242 facing the back-side of the substrates. The third nozzle set 907 includes nozzles A3 and A4 which face each other and are disposed adjacent to a first portion 911 of the edges of the substrate carrier 242. The fourth nozzle set 909 includes nozzles B3 and B4 that also face each other and are disposed adjacent to a second portion 913 of the substrate carrier edges. The design of each nozzle 901 is similar to the previous embodiment, but each nozzle 901 covers less area than the previous embodiment.

In removing residual water from the substrates, each set of nozzles 903, 905, 907 and 909 is pulsed in a selected pattern. For example, the pulse pattern begins by pulsing drying fluid at nozzles A1, A2 followed by nozzles A3, A4 followed by nozzles B1, B2 followed by nozzles B3, B4. The sequence is repeated as often as is necessary to remove substantially all water from the substrate. Alternatively, the pulse pattern begins at nozzles B3, B4 followed by nozzles B1, B2 followed by nozzles A3, A4 followed by nozzles A1, A2. Again, the sequence is repeated as often as is necessary to remove substantially all water from the substrate.

Optionally, the pulse drying is followed by flowing hot nitrogen gas over the substrate carrier 242. The hot nitrogen gas is ultra-pure nitrogen gas having a temperature of about 70° F. and preferably greater than 150° F., but no greater than 200° F. The hot nitrogen gas flows over the substrates for a period of time of at least about 30 seconds or more, or preferably about 50 seconds and more. The combination of hot nitrogen and pulse drying reduces actual drying time by about one half, as compared to drying solely by means of hot nitrogen and the like. The pulse drying step removes or evaporates liquid from the boundary layer. Pulse drying also removes or evaporates liquid on edges of the substrate. Alternatively, hot nitrogen gas alone can be used to dry the substrate. Of course, other carrier gases and combinations thereof may also be used depending on the particular application.

In a preferred embodiment, as described in more detail below, the present invention includes repeating the process a second time to rinse, clean and/or dry. In an optimal step, megasonic energy may be applied by a megasonic module while the wafer is surrounded by liquid (see FIGS. 12A–12C and 13A–13C), more preferably during both sequences of process (megasonic energy is generally not applied during the cleaning and N$_2$ drying process).

To further rinse and remove acid from the substrate, DI water flows past the substrate and cascades from a top portion of the vessel into a drain to cascade rinse the substrate. A quick dump follows the cascade rinse. Preferably, the quick dump occurs at a rate where the liquid level recedes in the processor at a rate greater than about 20 mm/sec. as measured from a substrate face. During the quick dump, clean nitrogen gas replaces the DI water, thereby preventing any oxidation of the substrate from air. Clean DI water fills the vessel and replaces the nitrogen to re-immerse the substrate in the DI water.

A combination of a carrier gas, including a cleaning enhancement substance, mixed with ultra-pure, non-reactive gas then slowly replaces the DI water to remove substantially all acid from the substrate. After another sequence of quick DI water fills and partial dumps, another gaseous mixture, including carrier gas and cleaning enhancement substance, replaces the DI water. The cleaning enhancement substance reduces the surface tension of the liquid on the substrate to enhance fluid flow therefrom. During removal of the liquid, the cleaning enhancement substance pulls particles off the substrate surfaces, thereby cleaning the substrate. To further dry the substrate and carrier, warm or hot nitrogen is pulsed into the vessel. The nitrogen has a temperature ranging from about 70° F. to about 250° F.

As previously noted, alternative embodiments may use a gas without any polar organic compound or the like to replace the DI water. In such embodiments, the gas replaces the DI water at a rate of about 2.50 mm/second or less as measured from the substrate face, and preferably at a rate of about 1.25 mm/second or less, and more preferably at a rate of about 0.80 mm/second or less. The gas without any polar organic compounds or the like may also be nitrogen at a temperature ranging from about 70° F. to about 250° F. To further dry the substrate and carrier, warm or hot nitrogen is pulsed into the vessel. The nitrogen has a temperature ranging from about 70° F. to about 250° F.

The aforementioned methods also include the use of a certain substrate support and a substrate carrier support to enhance wicking or to draw liquid away from the substrate and carrier. For example, the substrate support includes a knife edge that lifts the substrate to prevent accumulation of water at the substrate edges, and, in particular, the substrate bottom edges. The substrate carrier support wicks or draws the water from the surface of the substrate carrier, and tilts the carrier slightly from horizontal (relative to gravity or to the upper and or lower surfaces of the processor).

The slight tilt of the substrate carrier also tilts the substrates, which tends to prevent the substrates from sticking to each other. As previously noted, sticking substrates often accumulate water therebetween. The accumulation of water also accumulates particles which may be in the water. By removing the water and particles from the substrate, the present method can, for example, provide higher device yields on a typical semiconductor substrate.

Figure 10A:
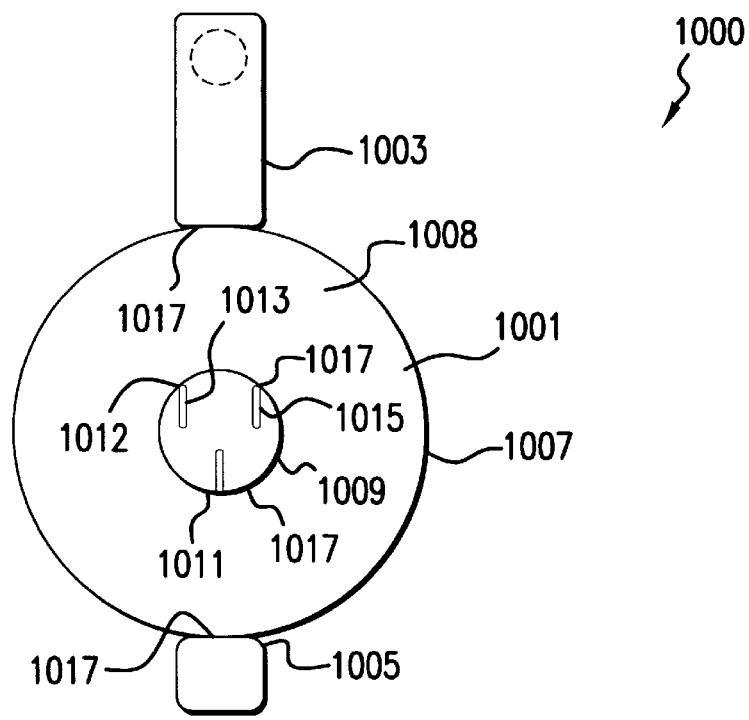
FIGS. 10A–10B are simplified cross-sectional view diagrams of an alternative embodiment of a substrate carrier according to the invention.
Figure 10B:
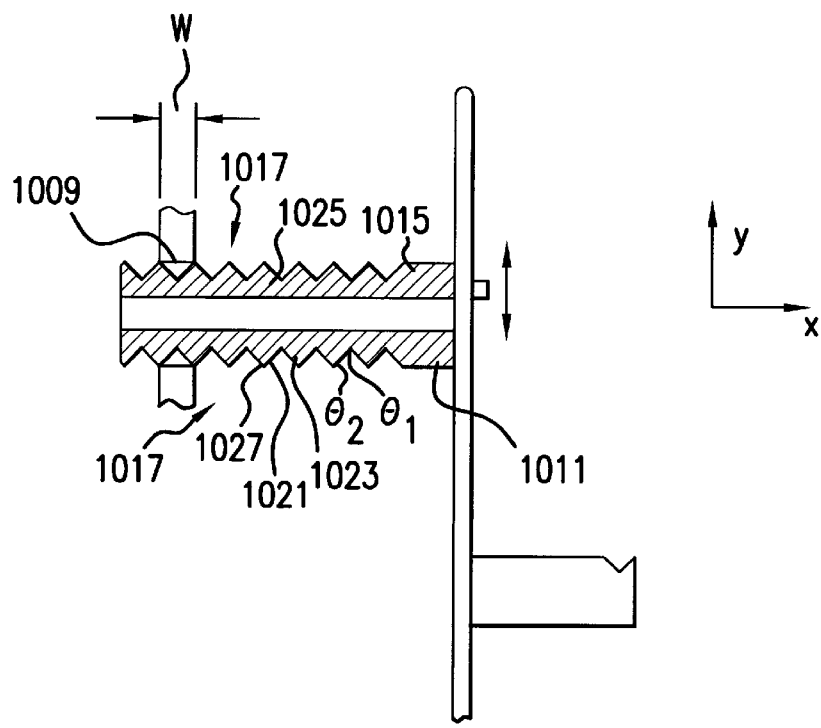

FIGS. 10A–10B are simplified cross-sectional view diagrams of a substrate carrier 1000 according to the invention. The substrate carrier 1000 is for a disk 1001 or the like. The substrate carrier 1000 includes a lower support beam 1005, an upper support beam 1003, and a plurality of center support beams 1011, 1013, and 1015. The support beams support or hold the disk 1001 in place. The disk 1001 is often a flat circular shaped article with an opening in its center region. The disk 1001 can be made of almost any type of material such as metal, plastic, and others. The disk 1001 has an inner periphery 1009, an outer periphery 1007, a face 1008 and other elements. In this embodiment, the inner periphery 1009 and the outer periphery 1007 are circular in shape. But the shape also can be square, rectangular, or the like. The face is substantially flat, but may also have small ridges thereon. In certain embodiments, the face can be porous.

The support beams also have knife edges 1017 that draw fluid or liquid away from the disk 1001 by breaking the surface tension of the fluid or liquid attached to the disk 1001. Typically, the fluid or liquid accumulates along edges of the inner and outer periphery. The support beams are located surrounding the periphery of the disk 1001 to draw fluid evenly from the disk 1001. Preferably, the support beams are spaced apart from each other at a relatively equal distance.

The center support beams 1011, 1013, and 1015 are illustrated by FIG. 10B. The center support beams 1011, 1013, and 1015 include the upper center support beams 1013, 1015 and the lower center support beam 1011. Preferably, each of the support beams has a knife edge 1017 or ridges formed thereon. The ridges have outer bevelled portions 1021, 1023, a lower center portion 1025, and an upper center portion 1027. Preferably, the lower center portion 1025 is defined at a lower region where the bevelled portions meet. The upper center portion 1027 is defined at a higher region where the bevelled portions 1021, 1023 meet. An angle $\theta_1$ defining the lower center portion 1025 between the bevelled portions 1021, 1023 ranges from about 85 to about 150°, and is preferably about 90 to about 120°. An angle $\theta_2$ defining the upper center portion 1027 between the bevelled portions 1021, 1023 ranges from about 85 to about 150°, and is preferably about 90 to about 120°. The angles $\theta_1$, $\theta_2$ are selected to draw liquid or fluid away from the disk 1001, thereby enhancing fluid flow or drying.

One of the center support beams 1011, 1013, and 1015 is adjustable in the y-direction. In this embodiment, the upper center support beam 1015 adjusts its location along the y-axis. This adjustment also allows the upper center support beam 1015 to firmly engage and hold the inner periphery 1009 of the disk 1001. Contact of the center support beams 1011, 1013, and 1015 with the inner periphery of the disk 1001 draws residual fluid on edges of the inner periphery along each center support beam 1011, 1013, and 1015. Preferably, the upper center support beam 1015 is also adjustable in the x-direction. More preferably, each of the center support beams 1011, 1013, and 1015 is adjustable in both the x-direction and the y-direction in the same plane. This adjustment facilitates the establishment of contact between the center support beams 1011, 1013, and 1015 and the inner periphery of the disk 1001.

The center support beams can be made of any suitable material, but the surface is preferably hydrophilic to draw water away from the disk 1001. The surface can be made of metal such as stainless steel, steel alloys, or others. The surface also can be made of plastics, glass, quartz, or the like. The material needs to have sufficient strength for durability, chemical resistance, and structural integrity. Of course, the type of material used and its surface depend upon the application.

Figure 11A:
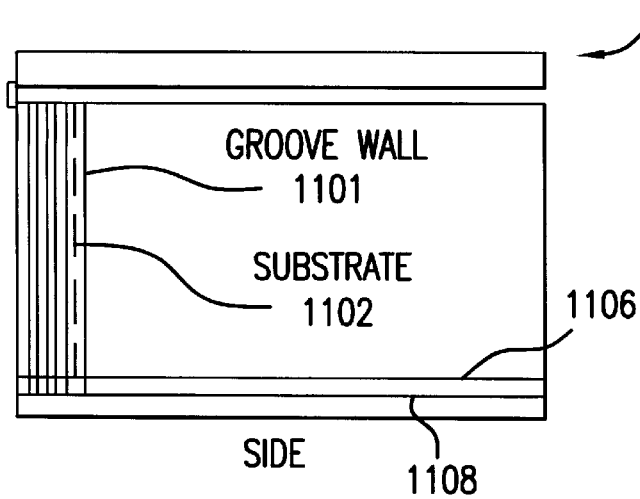
FIGS. 11A–11F are simplified cross-sectional view diagrams of an alternative embodiment of a substrate carrier according to the invention.

FIGS. 11A–11F are simplified diagrams of a substrate carrier 1100 according to another embodiment of the invention. FIG. 11A is a side view diagram of the substrate carrier 1100. The substrate carrier 1100 includes a plurality of walls 1101 and a plurality of substrates 1102 disposed therebetween. The substrates 1102 can be almost any type of substrate such as a semiconductor wafer or the like. Of course, the type of substrate used depends upon the particular application. Generally, fluid accumulates on edges of the substrates 1102 after cleaning or removing liquid from the substrate surfaces.

A plurality of lower substrate supports 1106, 1108, and an upper substrate support 1104 are also shown. Each of the substrate supports has knife edges 1107 engaged along the substrates' edges, which are used to draw fluid or liquid from the substrate edges. As previously noted, the knife edges 1107 break the surface tension of the fluid on the substrate edges, and draw such fluid, often with particles therein. This tends to remove residual or unwanted fluid from the substrate, and, in particular, the substrate edges.

Figure 11B:
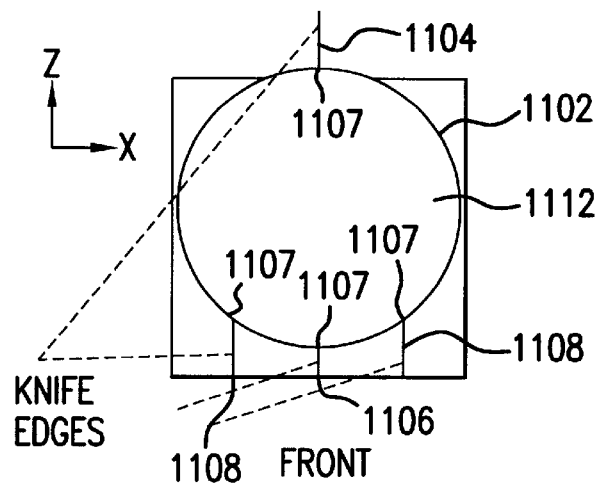

A front view diagram of the substrate carrier 1100 is shown in FIG. 11B. The front view diagram includes one of the substrates 1102 having a face 1112 and substrate edges 1111 (or an outer periphery). Three lower substrate supports 1106, 1108, 1110 are located near the bottom portion of the substrate 1102. Lower substrate support 1106 is located at a center bottom portion of the substrate 1102 and is perpendicular to the x-direction. Lower substrate supports 1108 are located perpendicular to the x-direction at an upper bottom portion of the substrate 1102. These substrate supports are disposed along the bottom surface of the substrate 1102 to support the substrate and draw any residual liquid from the substrate edges 1111. The upper substrate support 1104 is disposed perpendicular to the x-direction and engages an upper center portion of the substrate 1102. Preferably, the upper center portion is in-line in the y-direction with lower substrate support 1106, but also can be at other locations. Preferably, the upper substrate support 1104 firmly engages the upper center portion of the substrate 1102. This upper substrate support 1104 breaks the surface tension of fluid on the substrate edges 1111, and draws such fluid off, thereby enhancing substrate drying.

Figure 11C:
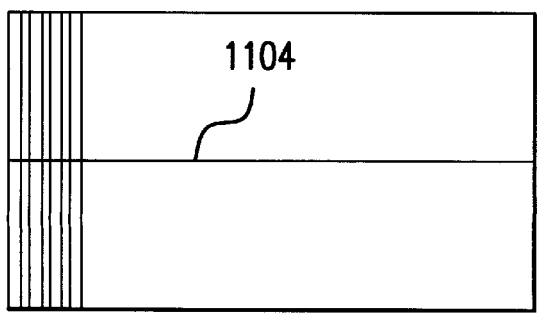
Figure 11D:
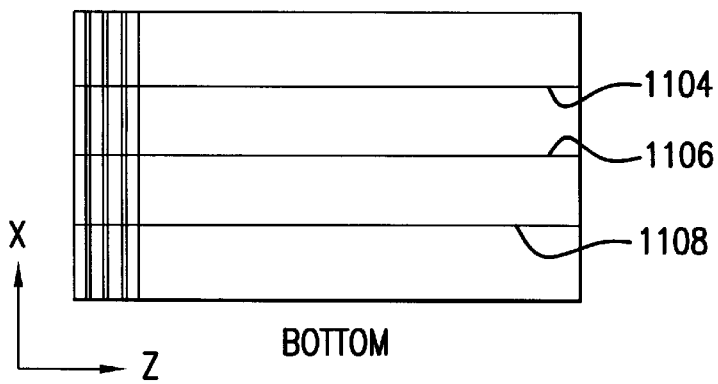

FIGS. 11C and 11D are a top-view diagram of the substrate carrier 1100 and a bottom-view diagram of the substrate carrier 1100, respectively. As shown, the upper substrate support 1104 is located overlying a center portion of the substrates along the z-direction. Bottom substrate supports 1106, 1108 run parallel to each other in the z-direction. The substrates supports 1106, 1108 also are spaced evenly among each other. Alternatively, the upper substrate support 1104 and bottom substrate supports 1106, 1108 also can be at other locations.

Figure 11E:
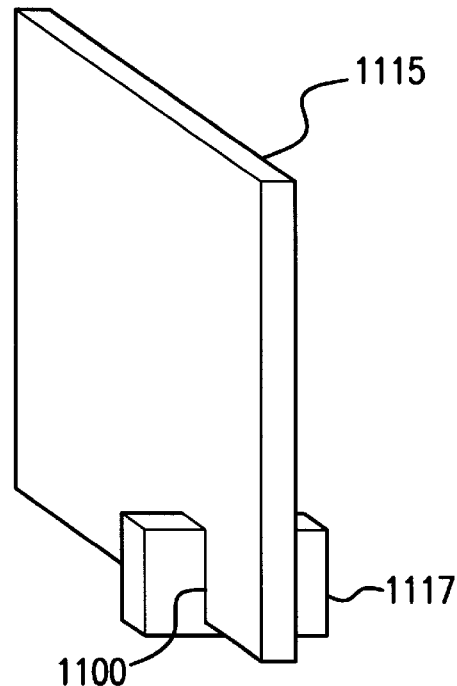
Figure 11F:
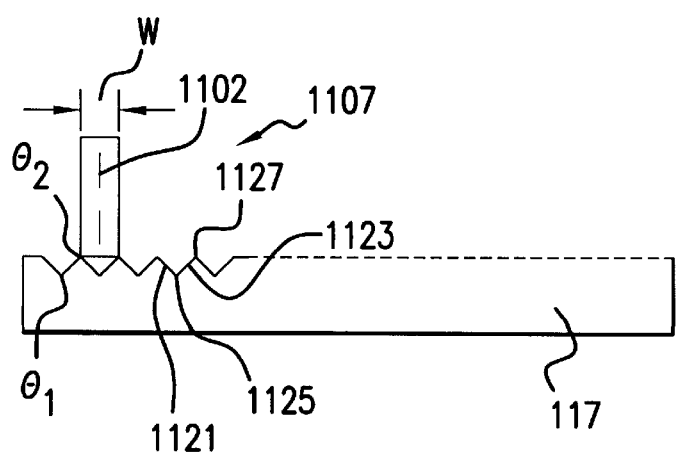

FIGS. 11E and 11F illustrate an example of a substrate support 1117 according to the invention. This substrate support 1117 can be any of the above substrate supports 1104, 1106, and 1108. The substrate support 1117 includes a notched portion which engages with a side 1115 of the substrate carrier 1100. This notched portion on the substrate support 1117 can be adapted to any conventional substrate carriers for use with invention. Engagement between the substrate support 1117 and the side 1115 can be accomplished using techniques such as welding, bonding, or other engagement means.

The substrate support 1117 can be made of any suitable material, but its surface is preferably hydrophilic to draw water away from the substrate. The surface can be made of metal such as stainless steel, steel alloys, or others. The surface also can be made of plastic, glass, quartz, or the like. The material of the surface needs to have sufficient strength for durability, chemical resistance, and structural integrity. Of course, the type of material used and its surface depend upon the application.

Each of the support beams has a knife edge 1107 or ridges thereon. The ridges have outer bevelled portions 1121, 1123, a lower center portion 1125, and an upper center portion 1127. Preferably, the lower center portion 1125 is defined at a lower region where the bevelled portions 1121, 1123 meet. The upper center portion 1127 is defined at a higher region where the bevelled portions 1121, 1123 meet. An angle $\theta_1$ defining the lower center portion 1125 between the bevelled portions can be between about 85° to about 150° and is preferably about 90° to 120°. An angle $\theta_2$ defining the upper center portion 1127 between the bevelled portions 1121, 1123 ranges from about 85° to about 150° and is preferably about 90° to about 120°. The angles $\theta_1$, $\theta_2$ are selected to draw liquid or fluid away from the disk 1001, thereby enhancing fluid flow or drying.

In addition, the aforementioned wet processing method(s) occur without movement of the substrate. In fact, the substrate carrier remains substantially stationary after being immersed, and during the drying, cascade rinse, and other steps. Since the substrate need not be moved, the wet processing system of the invention can have fewer mechanical parts and can be easier to use and maintain than certain prior art systems.

Moreover, the amount of polar organic compound used for each batch of substrates is typically less than a milliliter. The use of a relatively small amount of organic compound is often advantageous in methods of drying a substrate using highly flammable solvents (IPA, for example). In certain embodiments of the invention, no polar organic compounds or the like are used. Accordingly, the present method may be less hazardous to both the environment and the health of persons implementing the method of the invention than methods that rely heavily on use of flammable organic solvents.

Figure 12A:
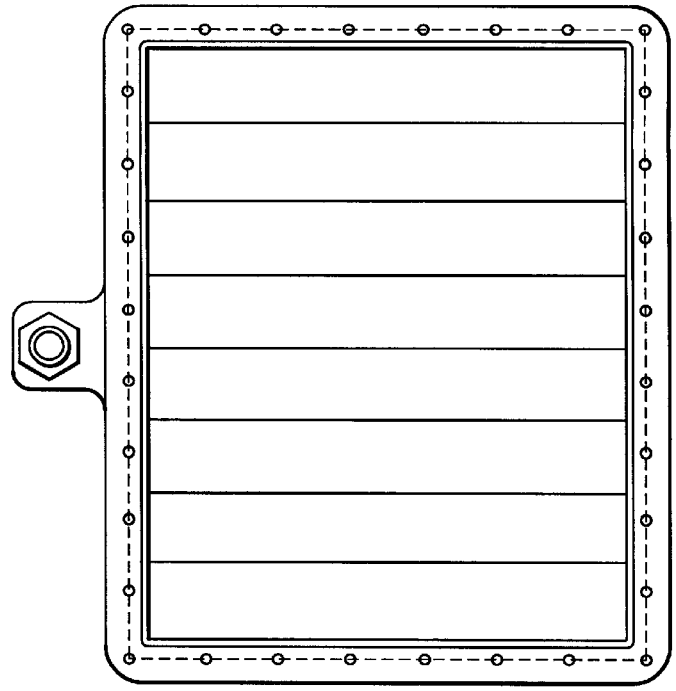
FIGS. 12A, 12B and 12C are a plan view, a side cross-sectional view and an end cross-sectional view, respectively, of a megasonic module that can be used with the invention, the megasonic module adapted to hold an 8 inch semiconductor wafer.
Figure 12B:
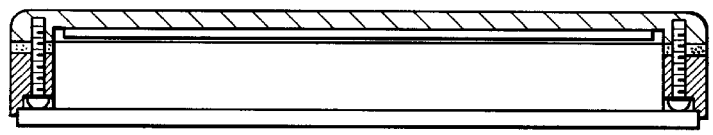
Figure 12C:
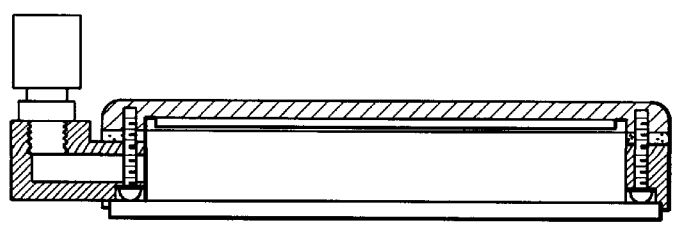
Figure 13A:
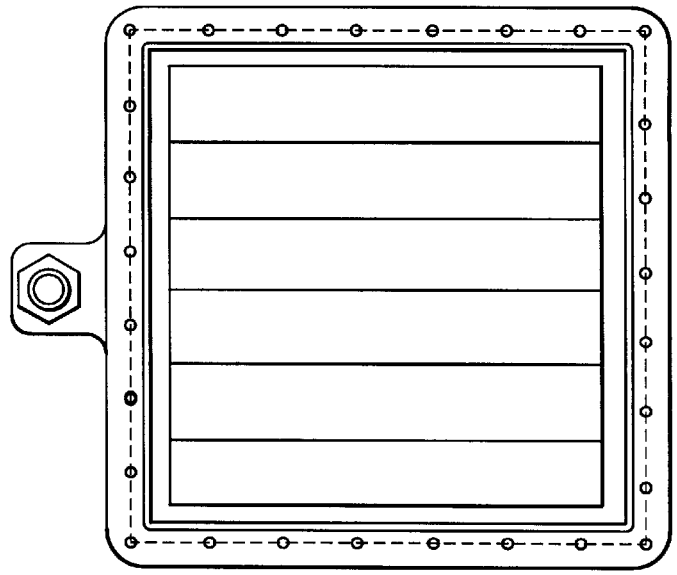
FIGS. 13A, 13B and 13C are a plan view, a side cross-sectional view and an end cross-sectional view, respectively, of a megasonic module that can be used with the invention, the megasonic module adapted to hold a 6 inch semiconductor wafer.
Figure 13B:
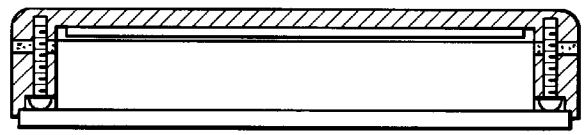
Figure 13C:
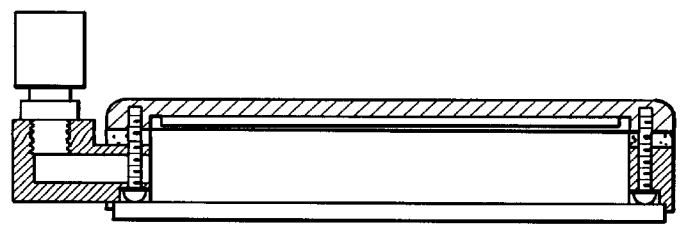

FIGS. 12A–12C are a plan view, a side cross-sectional view and an end cross-sectional view, respectively, of a megasonic module that can be used with the invention, adapted to hold a 8 inch semiconductor wafer. The megasonic module shown in FIGS. 12A–12C is commercially available. FIGS. 13A–13C are a plan view, a side cross-sectional view and an end cross-sectional view, respectively, of a megasonic module that can be used with the invention, adapted to hold a 6 inch semiconductor wafer. The megasonic module shown in FIGS. 13A–13C is commercially available.

The modules of FIGS. 12A–12C, and FIGS. 13A–13C can be operated conventionally and preferably in accordance with the following parameters. The applied power may be 300 watts per array. The operating frequency may be 600–800 kHz (auto-tuned). The operating temperature may be between 20 and 80 degrees Celsius. The power requirements are, generally, 200/208/220 VAC, 50/60 Hz, single phase at 15 amps.

Figure 14A:
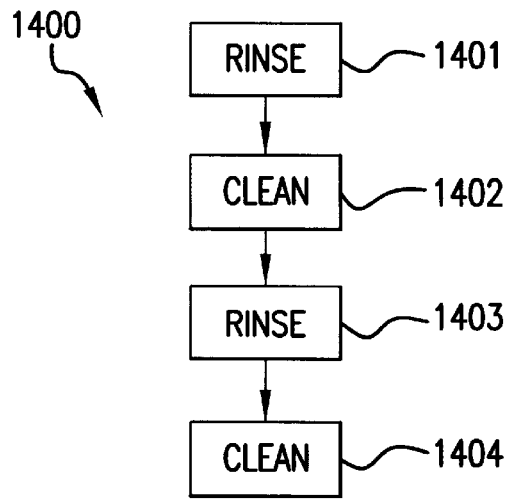
FIGS. 14A and 14B are flow charts of methods according to embodiments of the invention.

FIG. 14A is a flow chart of a method 1400 according to an embodiment of the invention for rinsing, cleaning and/or drying a substrate. In step 1401 of the method 1400, a substrate to be processed is rinsed with a fluid including water. The water can be deionized water. The rinsing step 1401 can be accomplished in any manner, either as described herein or as known by those skilled in the art. For example, the rinsing step 1401 can be accomplished by performing the immersion step 420 and rinse step 430 of the method 400 described above with respect to FIG. 5. In particular, megasonic energy can be applied to the water during immersion to aid in loosening particle from the surface of the substrate. In step 1402, cleaning is performed, as described above with respect to step 450 of the method 400 (FIG. 5). Preferably, the cleaning is accomplished using a carrier gas further including a cleaning enhancement substance (e.g., a polar organic compound) as described above. The step of cleaning is performed for a length of time adequate to remove nd/or prevent formation of some (or, preferably, substantially all) water stains from the surfaces of the substrate. Optionally, after cleaning, the substrate can be further dried by flowing nitrogen or similar gas over the surfaces of the wafer. In step 1403, a second rinsing operation may be performed. The rinsing step 1403 can be accomplished in any manner as described above for the rinsing step 1401. Next, in step 1404, a second cleaning is performed. The cleaning step 1404 can be accomplished in the same manner as the cleaning step 1402 and, again, may be performed for a length of time adequate to remove and/or prevent formation of some or substantially all water stains from the surfaces of the substrate.

Figure 14B:
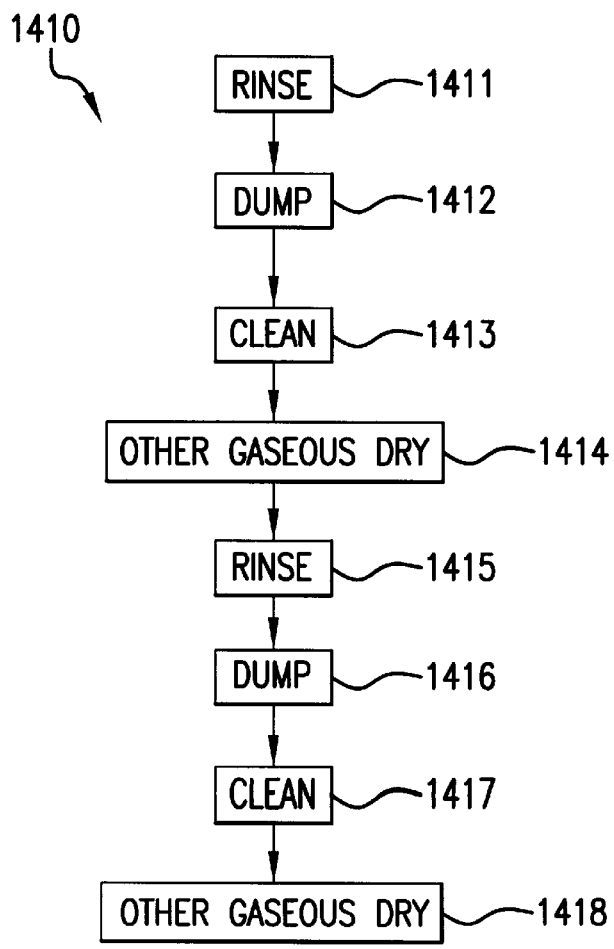

FIG. 14B is a flow chart of a method 1410 according to another embodiment of the invention. In step 1411, a substrate to be processed is rinsed with a fluid including water (e.g., deionized water), The rinsing step 1411 can be accomplished in the same manner as that described for the rinsing steps 1401 and 1403 of the method 1400 (FIG. 14A). For example, the rinsing step 1411 can be accomplished by performing a cascade rinse of the substrate, the rinsing fluid accumulating in a vessel so that the fluid surrounds the substrate, megasonic energy being supplied to the fluid to aid in causing particles to separate from the substrate surfaces. Deionized water can be used as the rinsing fluid. The rinsing step 1411 can be performed until the resistivity of the rinse water that is collected in the processor (or vessel) asymptotically approaches the resistivity of DI water as known by those skilled in the art. In step 1412, the rinsing fluid is removed from the vessel by dumping. The dumping step 1412 can be performed in the same manner as the step 440 of the method 400 (FIG. 5). In particular, as the rinse fluid is drained from the vessel during the dumping step 1412, the vessel is filled with nitrogen or other similar gas. The dumping step 1412 can be either a partial dump or a full dump. In step 1413, cleaning is performed. The cleaning step 1413 can be accomplished in the same manner as the cleaning steps 1402 and 1404 of the method 1400 (FIG. 14A) and, like the steps 1402 and 1404, is performed for a length of time adequate to remove substantially all water stains from the surfaces of the substrate. In step 1414, additional drying may be performed by passing a gas over the substrate surfaces. The drying step 1414 can be performed by passing hot nitrogen gas over the surfaces of the substrate. The drying step 1414 can also be accompanied by performing a conventional anti-static process that reduces attractive forces between charged areas of the surfaces of the substrate and oppositely charged particles on the surfaces. The drying step 1414 can be performed for a predetermined length of time sufficient to partially or fully dry the substrate. In steps 1415, 1416, 1417 and 1418, rinsing, dumping, cleaning and gaseous drying are performed once again. Each of the steps 1415, 1416, 1417 and 1418 can be performed in the same or a similar manner as the corresponding steps 1411, 1412, 1413 and 1414. For example, the rinsing step 1415 can be performed by filling the vessel with deionized water and applying megasonic energy to the water to aid in removing particles from the substrate surfaces. The dumping step 1416 can be either a full or partial dump. (If a partial dump is performed, then the vessel can be filled again, the substrate can be rinsed again, or the dump can be completed.) The cleaning step 1417 can be performed as described above so that substantially all water stains are removed from the substrate surfaces. The drying step 1418 can be performed by passing hot nitrogen gas over the substrate surfaces to completely dry the substrate surfaces and can be accompanied by the performance of a conventional anti-static process.

Advantageously, the methods 1400 and 1410 can take less time to perform than previous processes used to process a substrate. For example, the methods 1400 and 1410 can be completed in less than about 60 minutes, more preferably less than about 45 minutes, and most preferably less than about 30 minutes. Illustratively, the method 1410 can take about 20 minutes to complete.

Figure 15A:
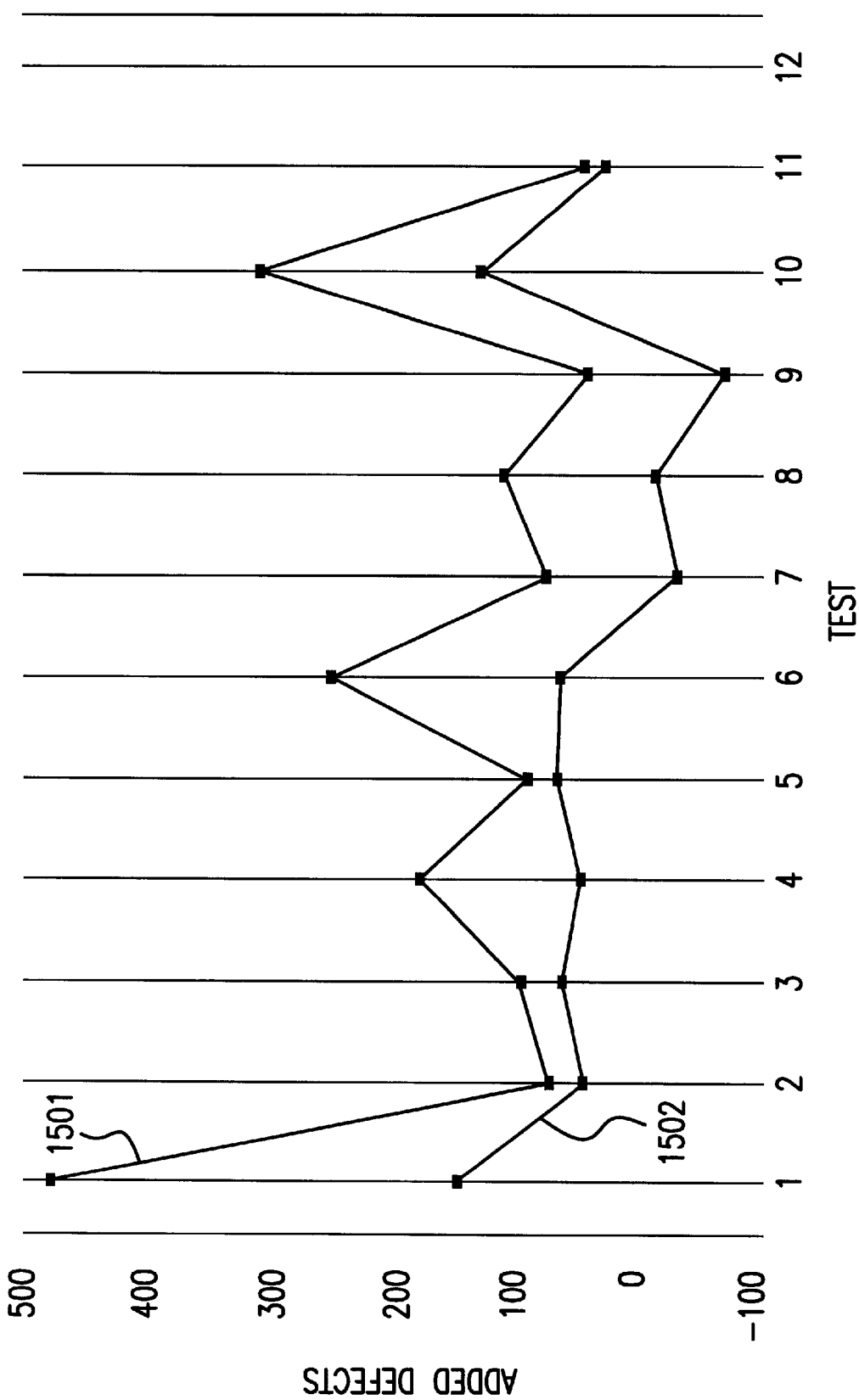

FIG. 15A and 15B are graphical comparisons of results obtained when a method according to the invention is used to rinse, clean and dry a semiconductor wafer to results obtained using another method (the "standard process") to rinse, clean and dry a semiconductor wafer. Each method was used to process a wafer including a layer of silicon dioxide left after an HF acid was used to etch the wafer to remove some of the silicon dioxide to expose the underlying silicon. The method according to the invention is the method 1410 of FIG. 14B. In the standard process, following the HF acid etch, the wafer was immersed in water, then subjected to a cascade rinse using deionized water and dried using a spin dryer. The wafer was then rinsed again and immersed (while applying megasonic energy). Finally, the wafer was dried using a spin dryer. The standard process required approximately 60 minutes to complete, longer than the method of the invention.

In FIG. 15A, the lines 1501 and 1502 show the number of additional defects measuring greater than 0.25 micrometers in diameter found, in each of eleven tests, on a wafer after the wafer was etched with HF acid, rinsed, cleaned and dried as described above. The line 1502 represents the results obtained using a method in accordance with the method 1410 of FIG. 14A3 while the line 1501 represents the results obtained using the standard process.

In FIG. 15B, the bar graphs 1511 and 1512 show the normalized yield of wafers after the wafers are etched, rinsed, cleaned and dried as described above. The yield is normalized with respect to the yield of the wafer processed by the method of the invention (shown by the bar 1512). The method exemplifying the invention was the method 1411, with megasonic energy being applied to the wafer when submerged in or surrounded by deionized rinse water. The bar 1511 shows the normalized yield of the wafer processed with the standard process.

Figure 15C:
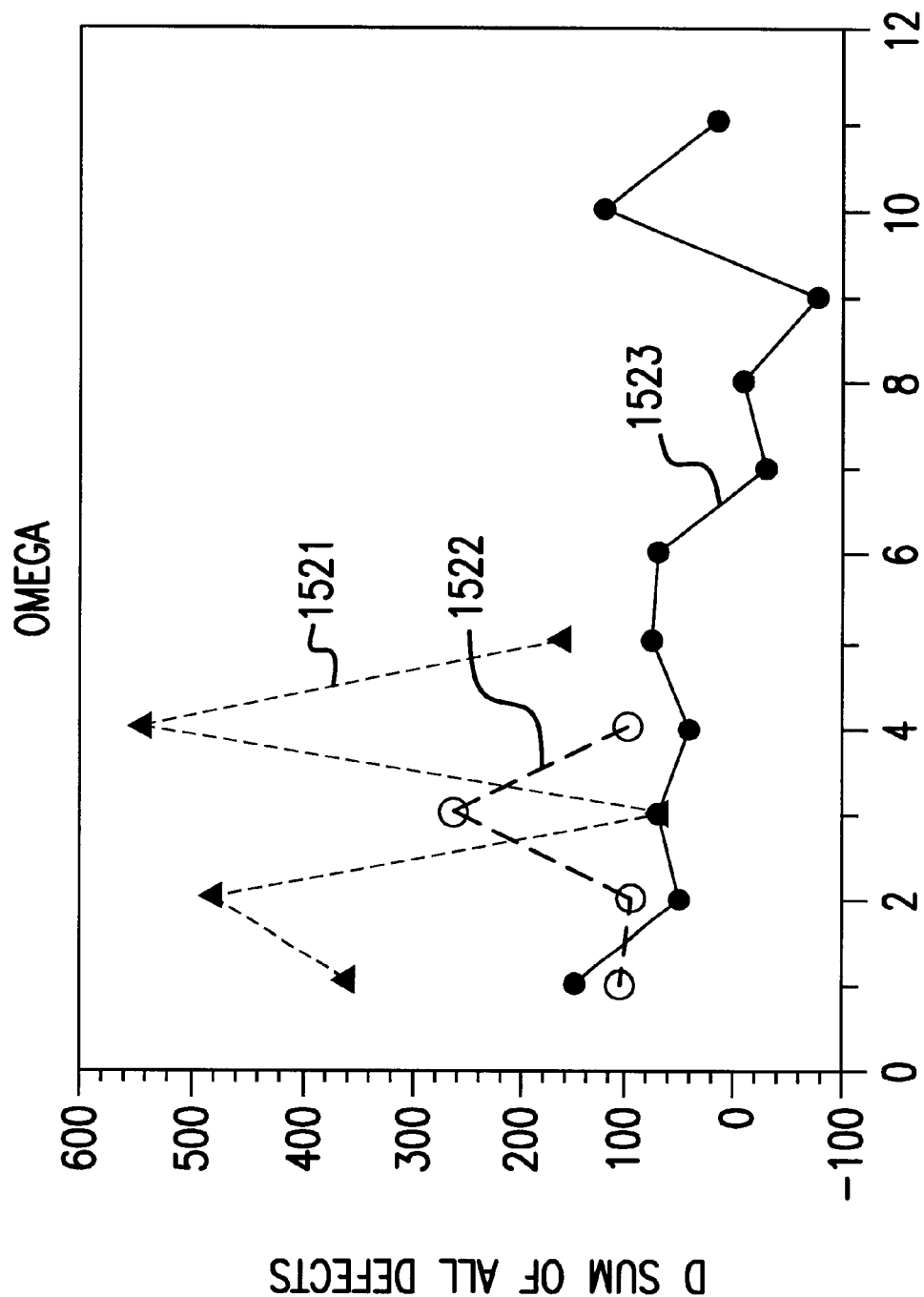
FIG. 15C is a graphical representation of results obtained when a method according to the invention is used to clean and dry a semiconductor wafer.

FIG. 15C is a graphical representation of results obtained when a method according to the invention is used to rinse, clean and dry a semiconductor wafer. Lines 1521, 1522 and 1523 each show the number of all additional defects found, in each of several tests, on a wafer after the wafer was etched with HF acid, rinsed, cleaned and dried in accordance with the invention as described with regard to FIGS. 15A and 15B. Line 1521 shows the number of additional defects that resulted after performing the steps 1411 through 1414 of the method 1410 (the step 1414 having been modified to fully dry the wafer), deionized rinse water being used with no additives. Line 1522 shows the number of additional defects that resulted after use of the method 1410 to rinse, clean and dry the wafer, a dilute solution of ammonium hydroxide and hydrogen peroxide having been added to the deionized rinse water. A dilute solution of ammonium hydroxide and hydrogen peroxide is a commonly used rinse water additive; the appropriate concentrations of the solution are known by those skilled in the art. Line 1523 shows the number of additional defects that resulted after use of the method 1410 to rinse, clean and dry the wafer, no additives having been used in the deionized rinse water.

The aforementioned embodiments also are used in other selected semiconductor fabrication process steps. For example, a method and/or apparatus according to the invention can be employed in pre-gate oxide cleaning. Pre-gate oxide cleaning is generally not performed due to the sensitivity of gate oxide layer formation to the presence of particles. That is, conventionally, pre-gate oxide cleaning typically introduced particles onto the semiconductor substrate. The present technique, however, actually removes any particles that may remain on the surfaces of the substrate before gate oxide layer formation, thereby improving the general quality of the gate oxide layer. The invention removes substantially all particles greater than or equal to about 0.5 microns, preferably greater than or equal to about 0.2 microns, and more preferably greater than or equal to about 0.1 microns.

In an alternative specific embodiment, the invention can be applied before other semiconductor process steps. These process applications are described in detail in a text written by Stanley Wolf and Richard N. Tauber, Semiconductor Processing For The VLSI Era, Vol. 1: Process Technology (1986) (herein "WOLF"). For example, the present cleaning and/or drying techniques may be applied as pre-epitaxial, pre-diffusion, pre-metal, pre-poly, pre-implant, pre-photoresist, and/or pre-stack oxide processing techniques. Generally, cleaning according to the invention can be performed at room temperature with trace quantities of polar organic compound. The trace quantity of polar organic compound at room temperature does not generally detrimentally affect the semiconductor or photoresists. As noted above, photoresists may dissolve during high temperature processing using solvents. As also previously noted, the invention actually removes particles, rather than introducing them.

In an alternative embodiment, processing according to the invention can be applied after performing a selected semiconductor fabrication process. An example of this fabrication process includes nitride deposition, polishing (e.g., chemical-mechanical polishing or CMP), buffered oxide etches, and metal deposition. These process steps also are described in great detail in WOLF. Processing according to the invention can also be performed after hydrofluoric acid last recipes and critical metal oxide silicon etches. As previously noted, the invention actually removes particles from the semiconductor, rather than introducing them.

Experiments

To prove the principle and demonstrate the operation of the present method and apparatus, experiments were performed.

In these experiments, a 6-inch silicon wafer was used as a substrate. The 6-inch silicon wafer included an overlying layer of high quality silicon dioxide, typifying a recently HF etched wafer with an overlying oxide layer. The 6-inch silicon wafer was placed in a wafer carrier, which was immersed into a bath of rinse water in a vessel. In the vessel, the 6-inch silicon wafer was held in a substantially vertical position, that is, faces of the wafer were substantially normal to the water level. The water was standard rinse water having a resistance of about 17 megohms and a temperature of about 70° F. In the immersed position, the wafer was substantially wet.

To dry the wafer, water was drained from the bottom of vessel. The water level was substantially normal to the wafer faces. The water was drained at a substantially constant rate from the bottom of the vessel. During the draining step, the wafer remained substantially motionless.

By way of an adjustable outlet valve at the drain, a different drain speed in multiple runs was used to determine the particular drain rates at which drying occurred more effectively. Drain speed is measured by the amount of time necessary to drain the water from the vessel in terms of decreasing water level measured in millimeters per second (mm/sec.).

Figure 16:
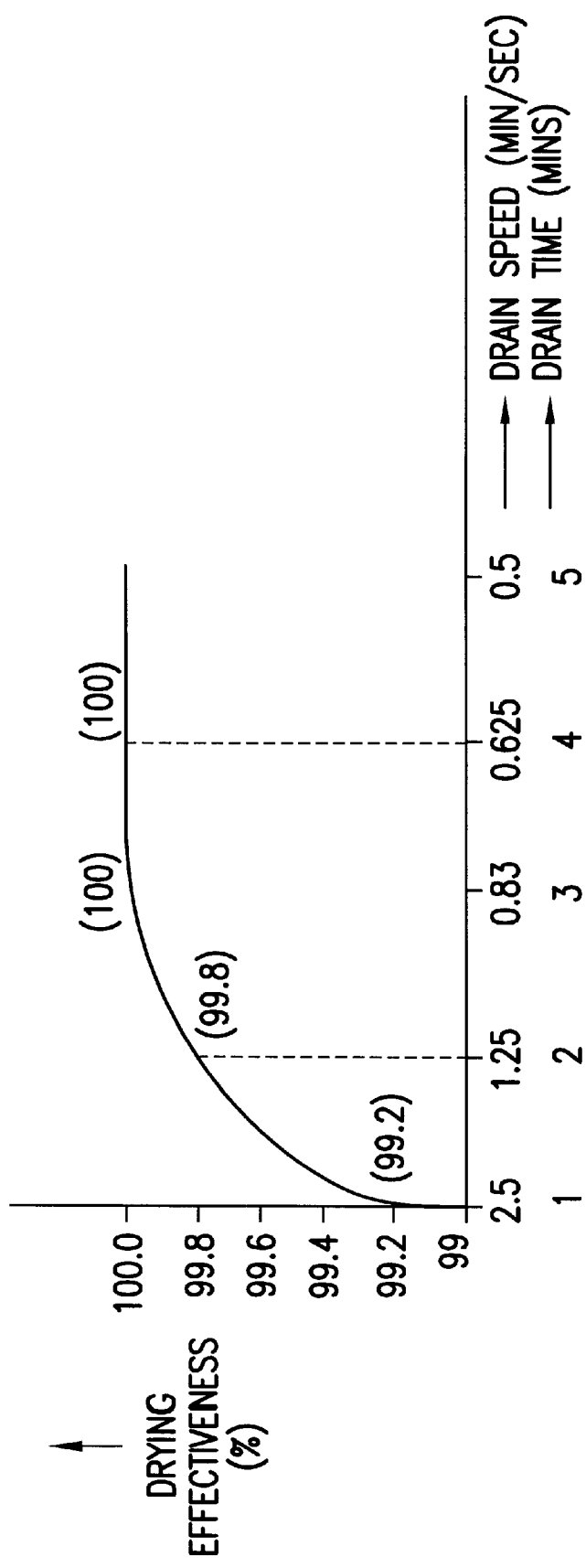
FIG. 16 illustrates drying effectiveness as a function of drain speed for an experiment performed according to the invention.

FIG. 16 illustrates "drying effectiveness" as a function of drain speed (in millimeters per second). Herein, "drying effectiveness" refers to the percentage of the surface area of the wafer without water residue. The surface area of the wafer includes the faces and wafer edge surfaces. As noted above, it is quite important to remove all water from the wafer which often includes a meniscus at the wafer edges. As shown, the drying effectiveness in this experiment is a non-linear function with respect to drain speed. For example, the drying effectiveness of the sample wafer is about 99.0% at a drain speed of about 2.5 mm/sec. A drain speed of about 1.25 mm/sec. has a drying effectiveness of about 99.8%. A drying effectiveness of about 100% (or completely dry wafer excluding wafer edges) was produced with a drain speed of about 0.83 mm/sec. and less. Any residual water on the wafer edges was removed by hot dry nitrogen being introduced for about 2 minutes or less. The process was then repeated automatically with no DI water dumps and immediately filled with DI water and into the cleaning and subsequent drying process.

This experiment showed that a substantially clean and dry wafer may be produced by a method according to the invention. The method of the invention does not rely upon any potentially harmful organic solvents or the like. In addition, the method of the invention provides a substantially clean and dry wafer without mechanical movement of the wafer, thereby decreasing the possibility of any mechanical damage of the wafer due to machine malfunction. Furthermore, the substantially clean and dry wafer may be provided without the use of a heater or heating element, thereby decreasing the hazard of fire. Accordingly, this experiment shows a safe, efficient, and easy method of cleaning and drying a wafer according to the invention.

While the above is a full description of specific embodiments of the invention, various modifications, alternative constructions, and equivalents may be used. For example, while the description above is given for a method and apparatus for cleaning and drying semiconductor substrates, it would be possible to implement the invention in the manufacture of raw wafers, disks and heads, flat panel displays, microelectronic masks, and other applications requiring high purity wet processing such as steps of rinsing, cleaning, drying and the like. In addition, the systems of FIGS. 1–5 are described as processing systems for semiconductors. A skilled artisan may, alteratively, employ such systems in other industries such as electrochemical, pharmaceutical, printed circuit board, optical devices, and any other industry that needs an improved technique to rinse and dry an article of manufacture. Furthermore, the apparatus of FIGS. 6–11F are described in terms of the present processing system, but also can be employed in any other cleaning system, drying system, rinse system, or the like. Therefore, the above description and illustrations should not be taken as limiting the scope of the invention which is defined by the appended claims.

What is claimed is:

1. A method for removing particles from a semiconductor wafer, comprising steps of:
   flowing a first liquid over a wafer in a substantially particle-free environment, wherein:
      the first liquid includes water; and
      the wafer includes a front face, a back face and an edge;
   removing said first liquid from said environment;
   drying said wafer by passing a first gas over said wafer; then
   flowing a second liquid over said wafer in said environment, wherein the second liquid includes water;
   removing said second liquid from said environment; and
   drying said semiconductor wafer by passing a second gas over said wafer, thereby effectively removing particles from said front face and said back face of said wafer.

2. The method of claim 1, wherein said particles are greater than or equal to about 0.5 microns in diameter.

3. The method of claim 1, wherein, before the step of flowing, said first and second liquids are substantially free of particles greater than about 0.2 microns in diameter.

4. The method of claim 1, wherein said wafer is at a non-zero angle from horizontal.

5. The method of claim 4, wherein said angle is equal to or less than about 15 degrees.

6. The method of claim 1, wherein said wafer is substantially stationary during each of said flowing and removing steps.

7. The method of claim 1, wherein said first and second liquids are removed at a rate of about 5.0 mm/sec. or less.

8. The method of claim 1, wherein the wafer has a first number of particles on said front face and on said back face prior to said method, and a second number of particles on said front face and on said back face after said method, said second number of particles being smaller than said first number of 1articles.

9. The method of claim 1, further comprising, after at least one of said flowing steps, introducing a cleaning enhancement substance into said environment.

10. The method of claim 9, wherein said cleaning enhancement substance is selected from the group consisting of a surfactant, isopropyl alcohol, di-acetone alcohol, helium, carbon dioxide, ammonia, and 1-methoxy-2-propanol.

11. The method of claim 9, wherein said cleaning enhancement substance is mixed with a carrier gas, said carrier gas being selected from the group consisting of air, nitrogen, inert gas, and argon.

12. The method of claim 9, wherein said cleaning enhancement substance comprises a polar organic compound in a concentration of less than or about 1000 ppm in a carrier.

13. The method of claim 12, wherein said concentration is about 500 ppm or less.

14. The method of claim 9, further comprising removing said cleaning enhancement substance from said environment.

15. The method of claim 1, wherein at least one of said drying steps comprises evaporative drying and substantially removes liquid droplets adhering to said wafer edge.

16. The method of claim 1, wherein at least one of said drying steps evaporates a boundary layer of liquid remaining on said front face and said back face of said wafer.

17. A method for removing particles from an object having a surface, comprising steps of:
   immersing said object in a first liquid comprising water in a substantially particle-free environment;
   introducing into said environment a first cleaning enhancement substance and a first carrier gas while removing said first liquid from said environment;
   drying said object by passing a first gas over said surface; then
   immersing said object in a second liquid comprising water in said environment;
   introducing into said environment a second cleaning enhancement substance and a carrier gas while removing said first liquid from said environment; and
   drying said object by passing a second gas over said surface, thereby effectively removing particles from said surface of said object.

18. The method of claim 17, wherein said object is selected from the group consisting of a flat panel display, a disk drive, a disk, a semiconductor wafer, a patterned semiconductor wafer, and a masked semiconductor wafer.

19. The method of claim 17, wherein, before said each of immersing steps said liquid is substantially free from particles greater than about 0.5 microns, and said method further comprises the step of flowing said liquid over said object at a rate of about 2.5 mm/sec. or less.

20. A method for reducing defects on a semiconductor wafer, comprising:

flowing a first liquid including water over said wafer in a substantially particle-free environment;

removing said first liquid from said environment;

passing a first gas over said wafer sufficient to dry said wafer;

flowing a second liquid including water over said wafer in said environment;

removing said second liquid from said environment; and passing a second gas over said wafer sufficient to dry said wafer, said method effectively reducing defects on said wafer.

* * * * *